United States Patent [19]

Sakata

[11] Patent Number: 5,450,350
[45] Date of Patent: * Sep. 12, 1995

[54] FILTER DEVICE AND ELECTRONIC MUSICAL INSTRUMENT USING THE FILTER DEVICE

[75] Inventor: Goro Sakata, Mitaka, Japan

[73] Assignee: Casio Computer Co., Ltd., Tokyo, Japan

[ * ] Notice: The portion of the term of this patent subsequent to Dec. 14, 2010 has been disclaimed.

[21] Appl. No.: 82,059

[22] Filed: Jun. 23, 1993

Related U.S. Application Data

[63] Continuation of Ser. No. 727,654, Jul. 9, 1991.

[30] Foreign Application Priority Data

Jul. 18, 1990 [JP] Japan ................. 2-189786

[51] Int. Cl.$^6$ ............................................. G06F 15/31
[52] U.S. Cl. ........................... 364/724.19; 84/DIG. 9
[58] Field of Search ............ 84/DIG. 9; 364/724.01, 364/724.15–724.17, 724.19, 488

[56] References Cited

U.S. PATENT DOCUMENTS

| | | |
|---|---|---|
| 4,422,156 | 12/1983 | Sano . |
| 4,467,440 | 8/1984 | Sano et al. . |
| 4,489,391 | 12/1984 | Morikawa . |
| 4,554,858 | 11/1985 | Wachi et al. . |
| 4,829,463 | 5/1989 | Kakishita et al. . |
| 5,081,605 | 1/1992 | Janssen . |
| 5,089,981 | 2/1992 | Cabot . |
| 5,103,416 | 4/1992 | Cavallotti et al. . |
| 5,111,417 | 5/1992 | Belloc et al. . |
| 5,140,541 | 8/1992 | Sakata et al. . |
| 5,149,902 | 9/1992 | Washiyama . |
| 5,150,623 | 10/1992 | Hayashi . |
| 5,255,202 | 10/1993 | Kido et al. ............... 364/724.01 X |
| 5,255,215 | 10/1993 | Sakata et al. ............ 364/724.19 |
| 5,270,954 | 12/1993 | Sakata ...................... 364/724.19 |

FOREIGN PATENT DOCUMENTS

| | | |
|---|---|---|
| 57-21117 | 2/1982 | Japan . |
| 59-44096 | 3/1984 | Japan . |

Primary Examiner—William M. Shoop, Jr.
Assistant Examiner—Jeffrey W. Donels
Attorney, Agent, or Firm—Frishauf, Holtz, Goodman, Langer & Chick

[57] ABSTRACT

A filter device has a variable frequency cut-off characteristic as well as a variable gain characteristic. To obtain these characteristics, a filtering operation is performed on data input thereto on the basis of a transmission function, which is defined by gain G for predetermined frequencies and a frequency fo corresponding to a phase at an intersection of a unit circle and a straight line intersecting at right angles a real axis passing a midpoint between a polar and a zero point on the real axis on Z-plane. An electronic musical instrument employing the filter device can change amplitudes of frequency components involved in musical tones on the basis of performance data, generating musical tones involving complex harmonics and having various tone colors, as a conventional acoustic instrument does.

22 Claims, 20 Drawing Sheets

- •: POLAR
- ○: ZERO POINT
- ×: POSITION DEFINED BY CUT-OFF FREQUENCY

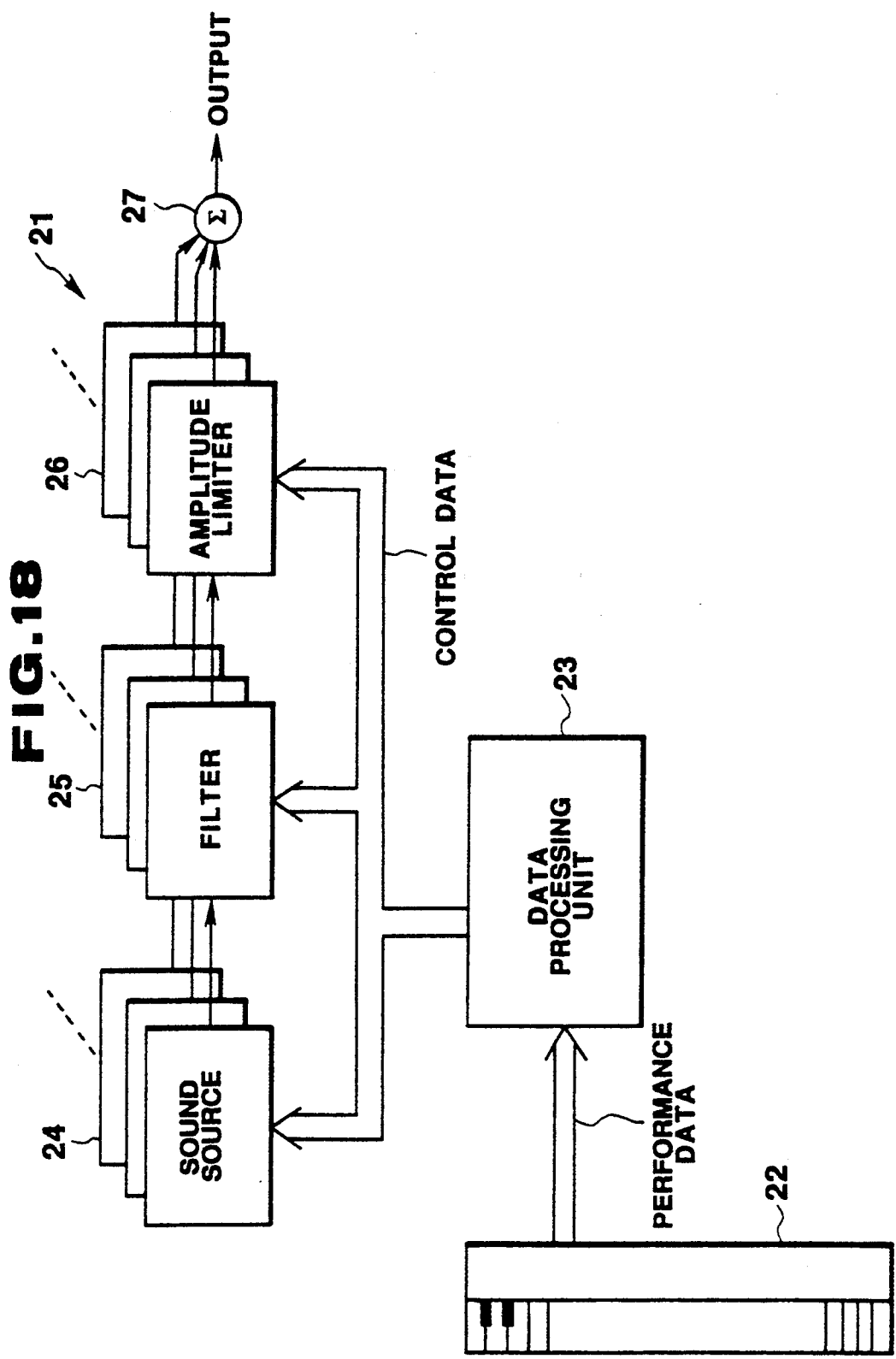

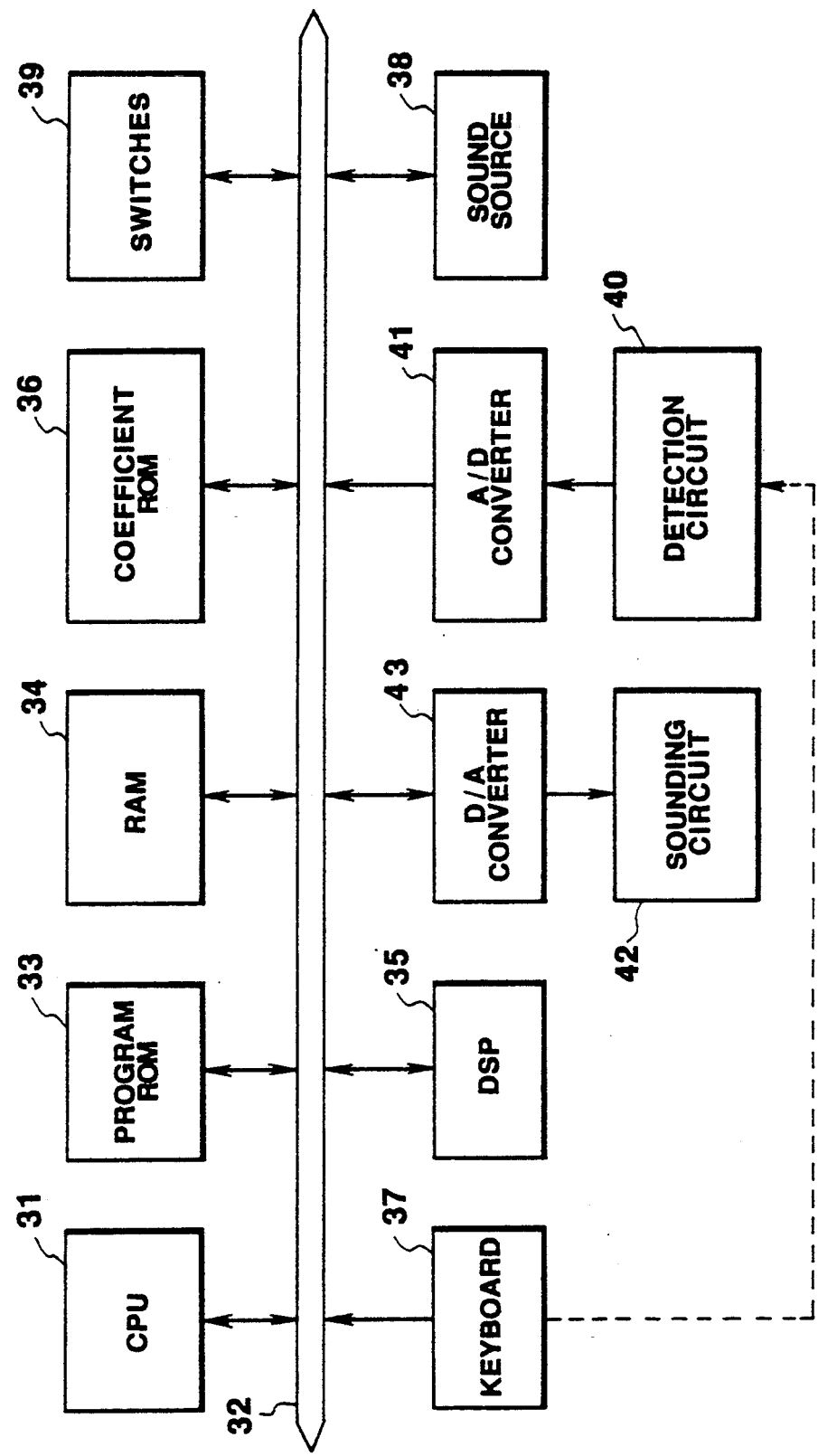

FIG.22

COEFFICIENT MEMORY (P)

| ADDRESS | CONTENS |
|---------|---------|
| 00 | $K_0$ |
| 01 | $b_{10}$ |
| 02 | $b_{20}$ |
| 03 | $K_1$ |
| 04 | $b_{11}$ |
| 05 | $b_{21}$ |
| $3n$ | $K_n$ |
| $3n+1$ | $b_{1n}$ |
| $3n+2$ | $b_{2n}$ |

FIG.23

WORK MEMORY (W)

| ADDRESS | CONTENTS |
|---------|----------|
| 00 | $Z_0$ |
| 01 | $OT_0$ |
| 02 | $Z_1$ |
| 03 | $OT_1$ |
| 04 | $Z_2$ |
| 05 | $OT_2$ |
| $2n$ | $Z_n$ |
| $2n+1$ | $OT_n$ |

# FILTER DEVICE AND ELECTRONIC MUSICAL INSTRUMENT USING THE FILTER DEVICE

This is a continuation of application Ser. No. 07/727,654 filed Jul. 9, 1991.

BACKGROUND OF THE INVENTION

1. Field of the Invention

The present invention relates to a filter device which transforms the shape of an input signal and to an electronic musical instrument using such filter device, and more particularly to a digital filter device which changes the strength and volume of sounds, and further changes tone color of musical tones in response to playing operation of a performer, for example, in response to performance data varying with time supplied from a keyboard and to an electronic musical instrument employing such digital filter device.

2. Description of the Related Art

In recent, techniques of processing digital signals have been developed and a number of electronic musical instruments are now in use which employ digital filters for varying tone color of the musical tones. One example of such electronic musical instruments is disclosed in Tokkai-sho 59-44096, which uses a digital filter as a circuit for varying tone color of the musical tones. In such an electronic musical instrument, a set of filter parameters are supplied to the digital filter and thereby the filtering characteristics (frequency vs. amplitude characteristics) are set. This type of digital filter controls parameters such as a cut-off frequency fc and a resonance. Variations in these parameters accompany with variations in tone color of musical tones. The cut-off frequency fc of the filter has a physical meaning as follows. In general, sounds generated by a sound source contain a number of harmonics. When the sound signal is applied to the digital filter, frequency components contained therein higher than the cut-off frequency fc are abruptly reduced in amplitude.

When, for example, the cut-off frequency fc of a low pass filter is set comparatively low, high frequency components contained in the sound signal are reduced. As the result, the output signal of the low pass filter generates sweet and soft sounds. When the cut-off frequency fc of the low pass filter is set higher, the sound signal of a wider frequency spectrum, i.e., the sound signal of a frequency spectrum substantially equivalent to the original sound is allowed to pass the filter. The frequency vs. amplitude characteristics are shown in FIG. 30. The resonance has effects that abruptly increase amplitudes of frequency components of the sound signal in the neighborhood of the cut-off frequency fc. As the result, the resonance will add peculiar effects to the sound.

In the conventional electronic musical instrument employing the digital filter mentioned above, only the cut-off frequency fc of the filter is changed in response to the respective performance data supplied thereto. Therefore, only a predetermined range of frequency components contained in the sound signal are reduced, i.e., a predetermined range of harmonics contained in the sound signal are reduced only in their amplitudes; besides, the tone color of the musical tones is changed only in a simple manner. In most of acoustic instruments, not only a frequency range in which harmonics are reduced is changed but also other parameters are changed. Therefore, an exquisite expression in the musical performance is not fully obtained only by changing the cut-off frequency fc of the filter. Since an attenuation factor in the cut-off frequency range of the filter is not variable and the resultant performance data is constant, electronic musical instruments are required to change another factors to give a wide variety of expressions in the musical performance.

SUMMARY OF THE INVENTION

The present invention has been made to dissolve the above mentioned drawbacks, and has an object of providing a filter device in which a certain frequency fo (corresponding to a cut-off frequency) is variable and a certain range of frequency components contained in a signal, higher than the frequency fo are changed to increase or decrease in amplitude, resulting in transformation of the shape of the signal.

According to one aspect of the invention, there is provided a filter device which comprises coefficient calculating means for calculating a position C on the real axis on Z-plane using a frequency fo corresponding to a phase at a point of the intersection of an unit circle and a straight line intersecting at right angles the real axis passing at a midpoint between a polar and a zero point thereon, for calculating distances d from the point C to the polar and from the point C to the zero point using the point C and a gain G for predetermined frequencies, and for calculating coefficients B1 and B2 from the following expressions:

$$B1 = C - d \text{ and } B2 = C + d,$$

and digital filter means for performing a filtering operation on signal data input thereto on the basis of a transmission function defined by the coefficients B1 and B2 calculated by said coefficient calculating means and for outputting the resultants.

According to another aspect of the invention, there is provided a filter device which comprises coefficient outputting means for outputting coefficients defined by a gain for predetermined frequencies and by a frequency fo corresponding to a phase at the intersection of a unit circle and a straight line intersecting at right angles a real axis on Z-plane at a midpoint between a polar and a zero point on the real axis, and digital filter means for performing a filtering operation on input signal data on the basis of a transmission function defined by the coefficients output from the coefficient outputting means, and for outputting the resultants.

The construction mentioned above allows coefficients K, B1 and B2 to be defined by a gain G for predetermined frequencies and by a frequency fo corresponding to a phase at the intersection of a unit circle and a straight line intersecting at right angles the real line on Z-plane passing a midpoint between a polar and a zero point on the real axis, and further allows an input signal to be subjected to a filtering operation on the basis of a transmission function defined by the coefficients K, B1 and B2.

Further, the construction changes not only the cut-off characteristic of the filter for attenuating a particular frequency range of frequency components contained in the input signal, but also changes a gain of the filter to increase or decrease amplitude of the input signal. Therefore, the construction is capable of showing functions of any type of filter, such as a low pass filter, a high pass filter, a band pass filter of a combination of the high and low pass filter, and a band reject filter.

Another object of the invention is to provide an electronic musical instrument that employs a filter device in which a frequency fo (corresponding to a conventional cut-off frequency) is changed, and a transmission characteristic of which is also changed to increase or decrease amplitudes of frequency components contained in the input signal, and more particularly to provide an electronic musical instrument which, in accordance with performance data, can change harmonics as well as tone color of the musical tones in a wide variety of ranges as an acoustic instrument does.

According to yet another aspect of the invention, there is provided an electronic musical instrument which comprises a performance operating means for inputting performance data, musical tone signal generating means for generating musical tone signal data on the basis of the performance data from said performance operating means, coefficient outputting means for outputting coefficients defined by a gain for predetermined frequencies and by a frequency fo corresponding to a phase at the intersection of a unit circle and a straight line intersecting at right angles a real axis on Z-plane at a midpoint between a polar and a zero point on the real axis, and digital filter means for performing a filtering operation on the musical tone signal data generated by said musical tone signal generating means on the basis of a transmission function defined by the coefficients output from said coefficient outputting means, and for outputting the resultant.

The construction mentioned above allows amplitudes of the frequency components in a particular range to be changed in accordance with performance data and also allows harmonics to be changed in a complex fashion and tone color of musical tones to be varied in a wide range as an acoustic instrument does.

BRIEF DESCRIPTION OF THE DRAWINGS

The other objects and features of the invention will be fully understood by those skilled in the art from the description of preferred embodiments and the accompanying drawings, of which:

FIGS. 1 through 17 are views for explaining the fundamental principle of the invention;

FIG. 1 is a circuit diagram of a primary-feedback digital filter;

FIG. 2 is a view showing a polar B1, a zero point B2 and a midpoint C on the real axis of Z-plane;

FIG. 3 is a view for explaining the polar B1, the zero point B2, the midpoint C, distance d, a frequency fo and an angle $\theta o$;

FIG. 4 is a view showing a polar vector B1P and a zero-point vector B2P when the primary-feedback digital filter operates as a low-pass filter;

FIG. 5 is a view showing the frequency characteristic of the digital filter when d>0, where d stands for a distance between a polar and the midpoint C of the polar and a zero point, or a distance between the zero point and the midpoint C of FIG. 4;

FIG. 6 is a view showing the frequency characteristic of the digital filter when d=0 in FIG. 4;

FIG. 7 is a view showing the frequency characteristic of the digital filter when d<0 in FIG. 4;

FIG. 8 is a view showing the frequency characteristic of the digital filter when it operates as a low-pass filter;

FIG. 9 is a vector chart showing a polar vector B1P and a zero-point vector B2P when the primary-feedback digital filter operates as a high-pass filter;

FIG. 10 is a view showing the frequency characteristic of the digital filter when d>0, where d stands for a distance between the polar and the midpoint C or between the zero point and the midpoint C of FIG. 9;

FIG. 11 is a view showing the frequency characteristic of the digital filter when d=0 in FIG. 9;

FIG. 12 is another vector chart showing a polar vector B1P and a zero-point vector B2P, where the polar takes the position of the zero point of FIG. 9 and the zero point takes the position of the polar of FIG. 9;

FIG. 13 is a view showing the frequency characteristic of the digital filter when d<0, where d stands for a distance between the polar and the midpoint C or between the zero point and the midpoint C of FIG. 9;

FIGS. 18 through 29 are views showing an embodiment of an electronic musical instrument using the filter device according to the present invention;

FIG. 18 is a view showing a whole configuration of the electronic musical instrument using the filter device;

FIG. 19 is a specific configuration of the electronic musical instrument;

FIG. 20 is a block diagram of functions of CPU for processing data under control of a program;

FIG. 21 is an internal circuit diagram of DSP;

FIG. 22 is a view showing an internal construction of the coefficient memory (P);

FIG. 23 is a view showing an internal construction of the work memory (W);

FIG. 24 is a flow chart of a timer-1 processing of CPU;

FIG. 25 is a flow chart of a timer-2 processing of CPU;

FIG. 26 is a flow chart of a timer-3 processing of CPU;

FIG. 27 is a flow chart of a timer-4 processing of CPU;

FIG. 28 is a flow chart of operation of DSP;

FIG. 29 is a view showing a digital filter realized by operation of DSP of FIG. 28.

DETAILED DESCRIPTION OF THE PREFERRED EMBODIMENTS

Now, embodiments of the invention will be described with reference to the attached drawings.

Explanation of Fundamental Principle

The fundamental principle of a filter device according to the invention will be described. FIGS. 1 through 17 are views for explaining the fundamental principle of the invention. In the filter device of the invention, a frequency can be changed, from which frequency the transmission rate begins varying, the rate of the variable gain can be changed, and further the gain can be changed so as to increase or decrease signals input thereto. Furthermore, the cut-off frequency as well as the amplifying range of frequency components contained in a signal to be supplied to the filter device can be set in a high frequency range, in a low frequency range, or in a specific range. Therefore, the filter device of the invention is different from a conventional low-pass filter, high-pass filter, band pass filter and a band reject filter which allow only frequency components in a specific frequency range to pass. For convenience, the filter device of the invention which has the cut-off and amplifying range in a high frequency range is referred to as a low-pass filter, the filter device which has the cut-off and amplifying range in a low frequency range is referred to as a high-pass filter, and the filter device (including a conventional band-pass filter and band reject filter) which has the cut-off and amplifying range in a specific frequency range is referred to as a band-pass filter. Hereafter, the principle of these filter devices will be described.

Figure 1:
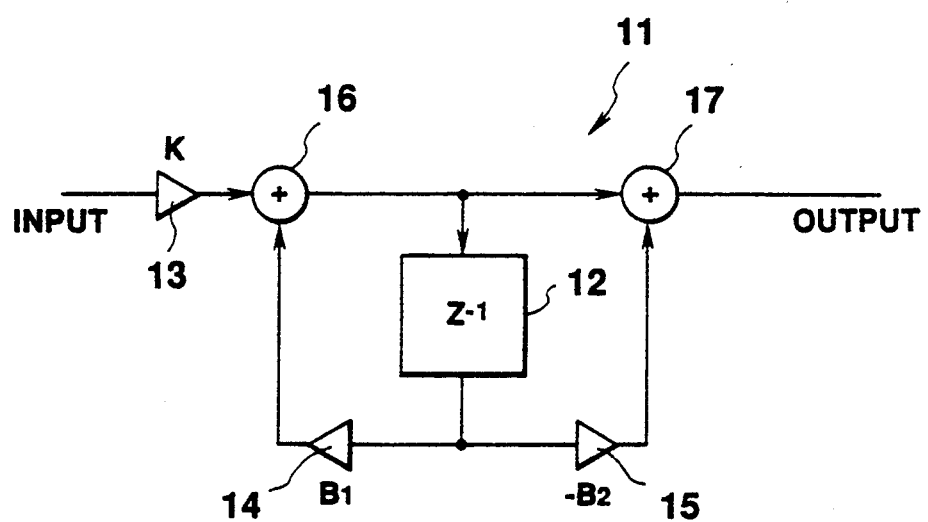
Figure 2:
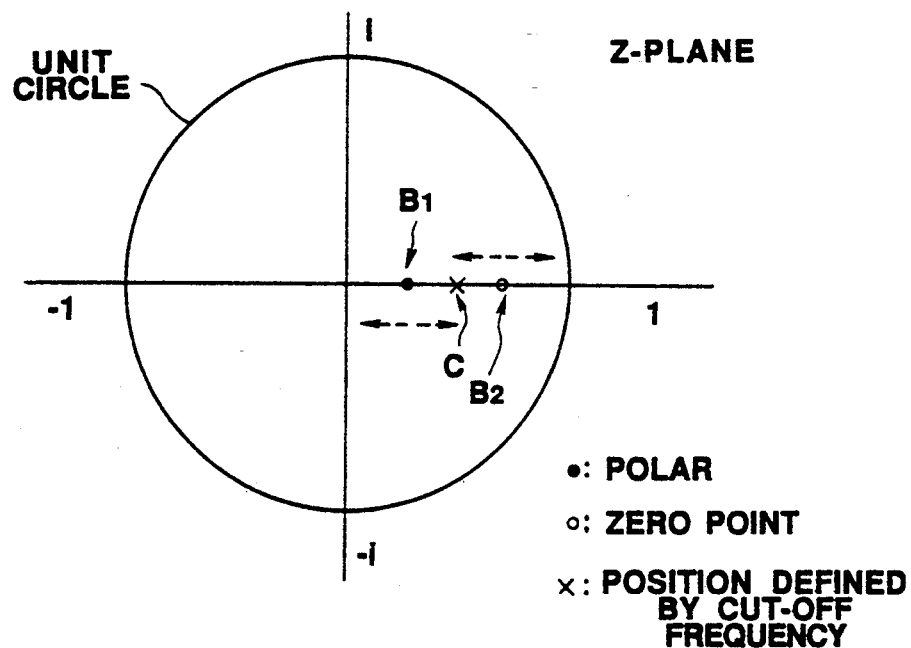

FIG. 1 is a circuit diagram of a primary feedback digital filter (so-called a twin primary digital filter) 11, which is composed of a digital signal processor (hereafter, referred to as DSP). The primary feedback digital filter 11 comprises a delaying element 12, multipliers 13 through 15 and adders 16 and 17. The transmission function H(Z) of the digital filter is given by the following expression (1):

$$H(Z) = K(1 - B2/Z)/(1 - B1/Z) \tag{1}$$

where the polar of the transmission function H(Z) is given by $Z = B1$ where the denominator $(1 - B1/Z)$ is equal to 0, and the zero point is given by $Z = B2$ where the numerator $(1 - B2/Z)$ is equal to 0. The polar and the zero point exist on the real axis within the unit circle on Z-plane of FIG. 2 and are represented by (polar) and 0 (zero point) as shown in FIG. 2. There are few conditions such as $B1 < B2$, $B1 > B2$ and $B1 = B2$, and a signal to be input to the digital filter are subject to an increasing gain characteristic of the filter or to a decreasing gain characteristic, depending on whether the polar be set left to the zero point on the real axis or be set right to the zero point.

Figure 3:
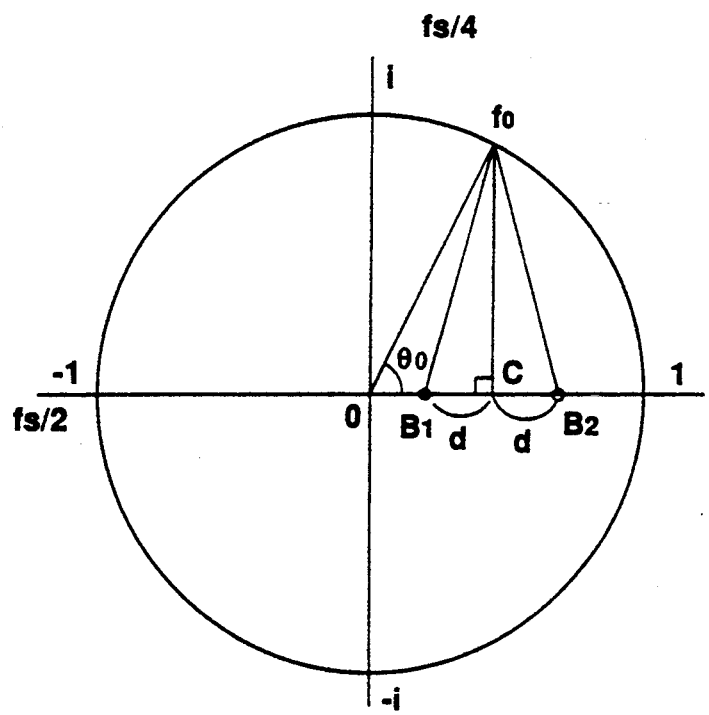

Assuming that the polar B1 is set left to the zero point B2, i.e., $B1 < B2$, and a symbol C stands for the midpoint between the polar B1 and the zero point B2, and further a symbol d stands for distances between the midpoint C and the polar B1, and the midpoint C and the zero point B2, as shown in FIGS. 2 and 3, then the following equations will be given:

$$B1 = C - d$$

$$B2 = C + d \tag{2}$$

Further, it is assumed that if $d > 0$, $B1 < B2$, if $d = 0$, $B1 = B2$ and if $d < 0$, $B1 > B2$. Then, in the above equations, the polar may take the position of the zero point, or the zero point may take the position of the polar by giving a sign "—" to the distance d.

Low-Pass Filter Operation

The frequency characteristic of the above digital filter will be given as $H(e^{j\Omega})$ by substituting $e^{j\Omega}$ for Z of H(Z) and the amplitude characteristic will be by the absolute value of the frequency characteristic $H(e^{j\Omega})$. If the amplitude characteristic of the digital filter is set such that $|H(e^{j\Omega})|\Omega = 0 \to 1$ where $Z \to 1$, then we obtain $$H(e^{j\Omega}) = K(1 - B2 \times e^{-j\Omega})/(1 - B1 \times e^{-j\Omega}) \tag{3}$$

Then, $$K(1 - B2)/(1 - B1) = 1$$

$$K = (1 - B1)/(1 - B2) \tag{4}$$

Again, assuming that an intersection of the unit circle and a line perpendicular to the real axis from the midpoint C as shown in FIG. 3 represents a frequency fo having particular frequency data, the angle decided by the frequency fo and the real axis at the central of the unit circle is $\theta 0$, and a sampling frequency is fs, then a position of $\Omega$ on the unit circle represents the reproducible maximum frequency fs/2 accompanying no noise. Therefore, the following relationship will be obtained from the above corresponding relationship:

$$fs/2: \Omega = fo:\theta 0,$$

$$\theta o = 2\pi fo/fs.$$

Accordingly, the midpoint C will be given by $$C = \cos \theta o = \cos (2\pi fo/fs) \tag{5}$$

The above frequency fo is something like the conventional cut-off frequency fc, but the frequency fo is not defined as the cut-off frequency fc. The frequency fo is a frequency from which the transmission characteristic of the filter 11 begins to vary, and the frequency fo is represented by the intersection point of the unit circle and a line perpendicular to the real axis from the midpoint C between the polar and the zero point. In addition, the frequency fo represents not only a cut-off frequency but also such a frequency that frequency components higher than the frequency are increased. Therefore, the frequency fo is different from the conventional cut-off frequency fc.

Now, it is assumed that the value of distance d is changed with the frequency fo fixed at a particular frequency.

(1) $d > 0$ (i.e., $B1 < B2$)

By multiplying the right side of the absolute value of $H(e^{j\Omega})$ by $e^{j\Omega}$, we obtain $$|H(e^{j\Omega})| = (e^{j\Omega} 631 B2)/(e^{j\Omega} B1)$$

Figure 4:
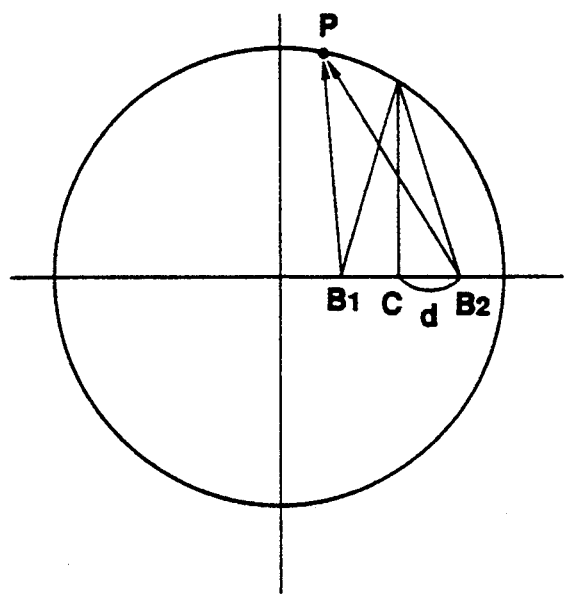

The absolute value of the right side of this equation may be obtained from the ratio of a distance between a point on the circumference of $e^{j\Omega}$ and the zero point B2 to a distance between a point on the circumference of $e^{j\Omega}$ and the polar B1. More specifically, if a symbol P denotes a point traveling on the unit circumference $e^{j\Omega}$, the amplitude characteristic $H(e^{j\Omega})$ will be specified by the absolute value of a constant K, a ratio of a length of a zero vector B2P to a length of a polar vector B1P as shown in FIG. 4. That is, $$|H(e^{j\Omega})| = K \times |B2P/B1P| \tag{6}$$

Figure 5:
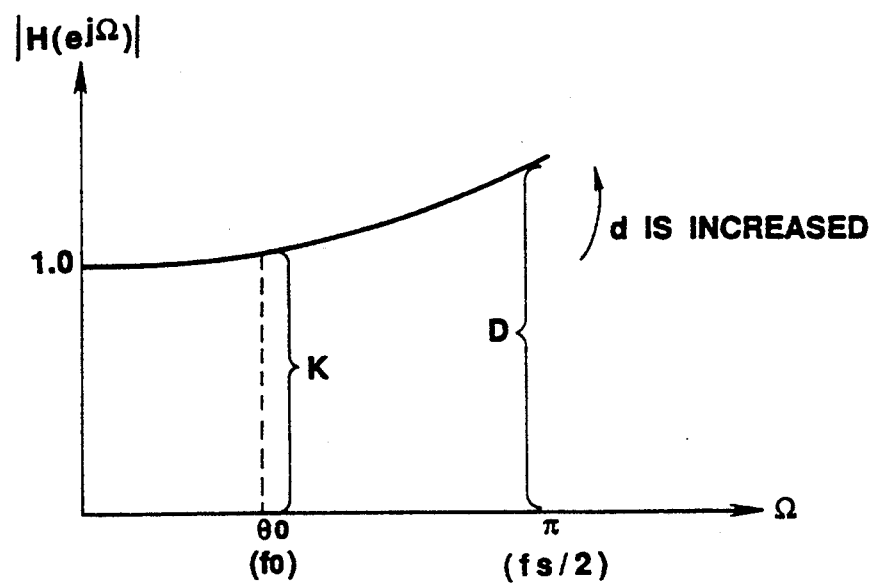

As will be apparent from FIG. 4 and the equation (6), the amplitude characteristic, i.e., the absolute value of $H(e^{j\Omega})$, increases monotonously. When $B1P = B2P$, or $\theta = \theta 0$ ($= 2\pi fo/fs$), the amplitude characteristic takes a value of K. Accordingly, a filtering characteristic (a frequency vs. amplitude characteristic) which increases monotonously will be shown in FIG. 5 when the amplitude characteristic $|H(e^{j\Omega})|$ takes a value 1.0 at a frequency $\Omega=0$. As shown in FIG. 5, when the frequency $\Omega$ is $\theta 0$ (=fo), the amplitude characteristic $|H(e^{j\Omega})|$ is a value of a constant K and when the frequency $\Omega$ is $\pi(=fs/2)$, the amplitude characteristic $|H(e^{j\Omega})|$ takes a value of D.

The larger the value of d is made, the larger the ratio of the zero vector B2P to the polar vector B1P will be. Consequently, the monotonously increasing rate of the amplitude characteristic $|H(e^{j\Omega})|$ will be increased.

d=0 (i.e., B1=B2)

Figure 6:
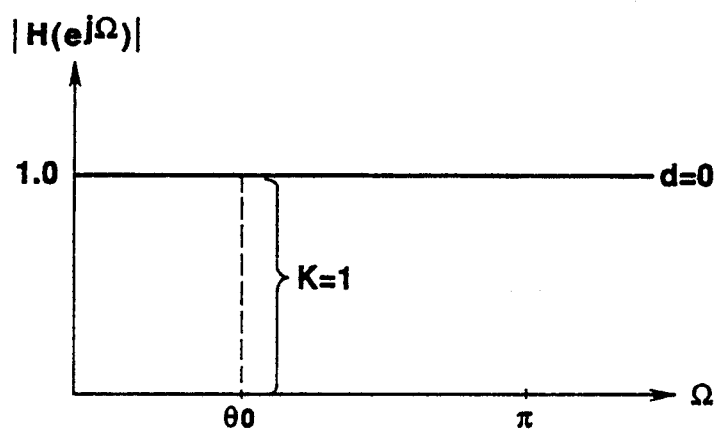

When the value of d is made smaller, the increasing rate of the amplitude characteristic $|H(e^{j\Omega})|$ will be decreased. When d=0, then $$K(1-B1)(1-B2)=1 \quad (7)$$

and the amplitude characteristic of the filter is flat as shown in FIG. 6. Therefore an input signal is not subject to any change in shape.

(3) d<0 (i.e., B1>B2)

Figure 7:
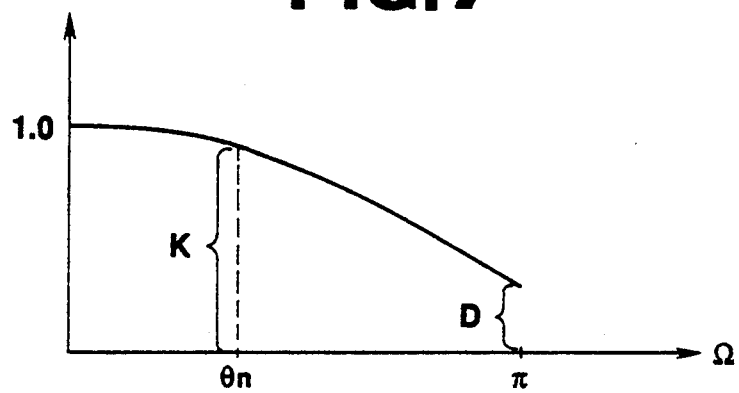

In case of d<0, the polar B1 is substituted with the zero point B2 and vice versa. The smaller the value of d is made, the smaller the ratio of the zero vector B2P to the polar vector B1P will be. Consequently, the monotonously decreasing rate of the amplitude characteristic $|H(e^{j\Omega})|$ will be increased. The filtering characteristic (frequency vs. amplitude characteristic) of the filter is shown in FIG. 7. When a frequency $\Omega$ is $\theta o$, the amplitude characteristic takes a value K, and when a frequency is $\pi$, the amplitude characteristic takes a value D.

Figure 8:
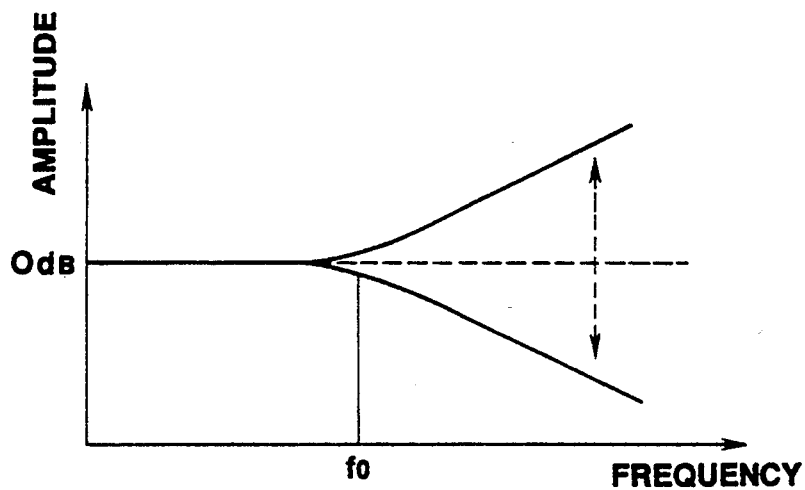

Accordingly, the digital filter 11 shall show a characteristic of a low-pass filter as shown in FIG. 8 in accordance with the polar and the zero point, a specific frequency fo, and a distance d. The digital filter 11 has such a characteristic as shown in FIG. 8 for specific parameters and these parameters will be calculated as described below.

Now, we define the amplitude characteristic $|H(e^{j\Omega})|$ as $|H(e^{j\Omega})|_{\Omega=\pi}=D$ at $\Omega=\pi$ (i.e., f=fs/2) from relations of coefficients B1, B2, K to fo and D. Then, $$|H(e^{j\Omega})|_{\Omega=\pi}=K(1+B2)/(1+B1)=D$$

$$(1-B1)/(1-B2)\times(1+B2)/(1+B1)=D \quad (8)$$

Substituting B1=C−d, B2=C+d (expression (2)) to the expression (8), we obtain $$[1-(C-d)]/[1-(C+d)]\times[1+(C+d)]/[1+(C-d)]-=0 \quad (9)$$

$$(1-D)d^2+2(1+D)d+(C^2-1)=0 \quad (10)$$

Now, we obtain $$d=[(1+D)\pm\{(D+1)^2+(D-1)^2(C^2-1)\}^{\frac{1}{2}}/(D-1) \quad (11)$$

$$d=A\pm\{A^2+C^2-1\}^{\frac{1}{2}} \quad (12)$$

where A=(D+1)/(D−1) and $|d|<1$, because, if d should not be within the unit circle, the digital filter does not work in a steady state. Actually, such a solution as satisfies a condition $|d|<1$ is selected from the above two solutions.

Now, it will be apparent from the above mentioned, that, to defend the characteristic of a filter, the frequency fo and the gain G [dB] is set, and then the coefficients B1, B2 and K will be obtained from the following expressions. Once values of the coefficients B1, B2 and K are obtained, a digital filter may be realized which has function similar to a low-pass filter and which processes signals in a digital fashion.

C=cos (2 $\pi$fo/fs)

d=A±{A²+C²−1}^{½}, where $|d|<1$

A=(D+1)/(D−1)

D=10^{G[dB]/20}

B1=C−d

B2=C+d

K=(1−B1)/(1−B2)

The principle of the digital filter has been described which shows a function similar to a low-pass filter, but the similar principle allows the digital filter to have another function, i.e., a function similar to a high-pass filter, too.

High-Pass Filter Operation

To make the digital filter 11 operate as a low-pass filter, H(Z) is made to approach 1 as Z approaches 1, while, to make the digital filter 11 operate as a high-pass filter, H(Z) may be made to approach 1 as Z approaches −1. In other words, a constant K is decided as $\Omega=0$.

In this case, $$K(1+B2)/(1+B1)=1$$

$$K=(1+B1)/(1+B2) \quad (21)$$

It depends on the sign of d, i.e., "+" or "−" which characteristic curve the amplitude characteristic draws.

(1) d>0 (i.e., B1<B2) .

Figure 9:
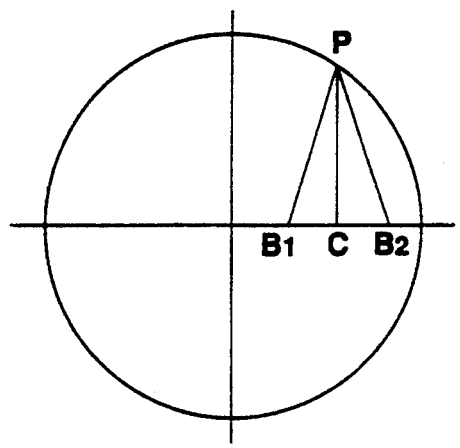
Figure 10:
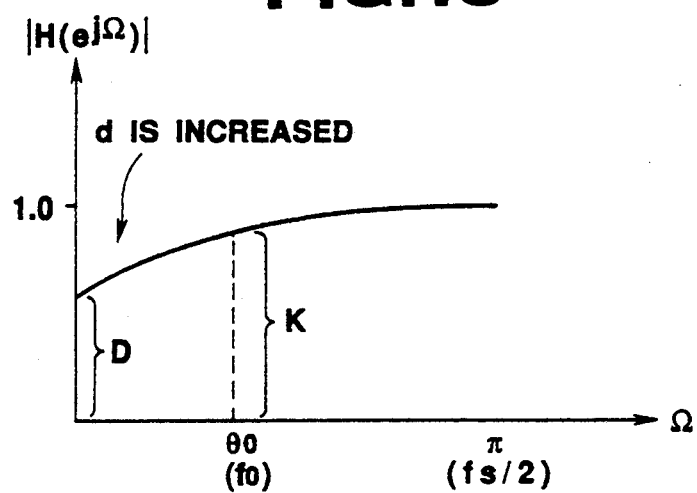

As shown in FIG. 9, the polar B1 takes a position left to the zero point B2. Accordingly, the amplitude characteristic $H(e^{j\Omega})$ shows a filtering characteristic shown in FIG. 10, as $\theta o(=fs/2)=1.0$. In this case, the larger the value of d is made, the larger the monotonously increasing rate of the amplitude characteristic becomes. As shown in FIG. 10, the value of $|H(e^{j\Omega})|$ corresponds to a value of the constant K at the frequency $\Omega=\theta o(=Fo)$ and is equivalent to a value of D at the frequency $\Omega=0$.

The constant K of FIG. 10 is equivalent to the constant K of FIG. 5 except the signs of B1 and B2 as apparent from the equations (21) and (7). Therefore, the value of the constant K, B1 and B2 are previously memorized in ROM and an appropriate selection of these K, B1, B2 from ROM allows the digital filter to have a characteristic of a low-pass filter or a characteristic of a high-pass filter.

(2) D=0 (i.e., B1=B2)

Figure 11:
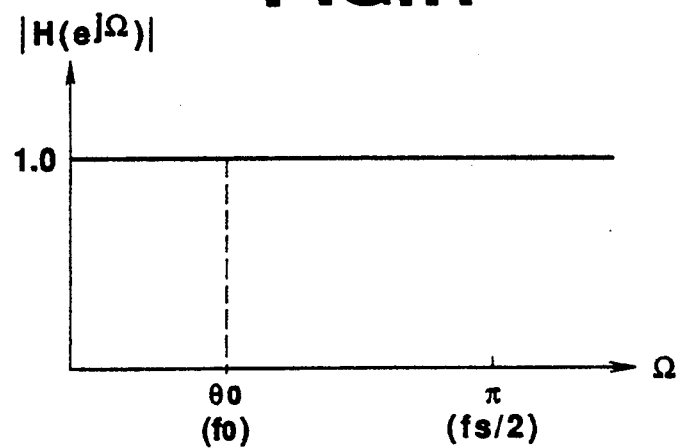

Similarly to the case of FIG. 5, the amplitude characteristic is of a flat characteristic as shown in FIG. 11.

(3) d<0 (i.e., B1>B2)

Figure 12:
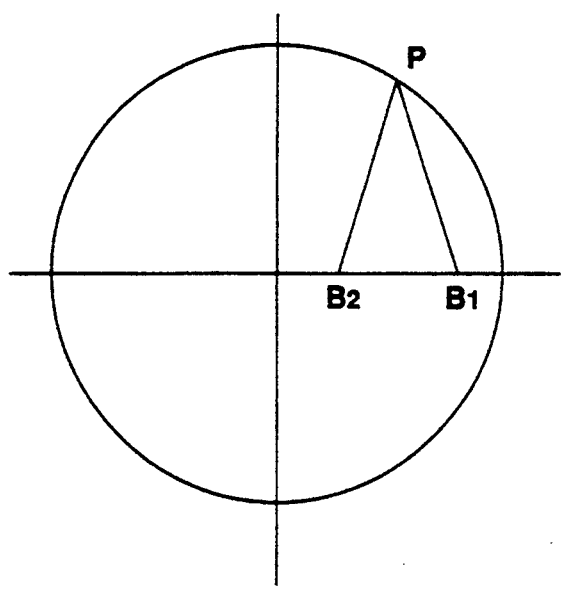
Figure 13:
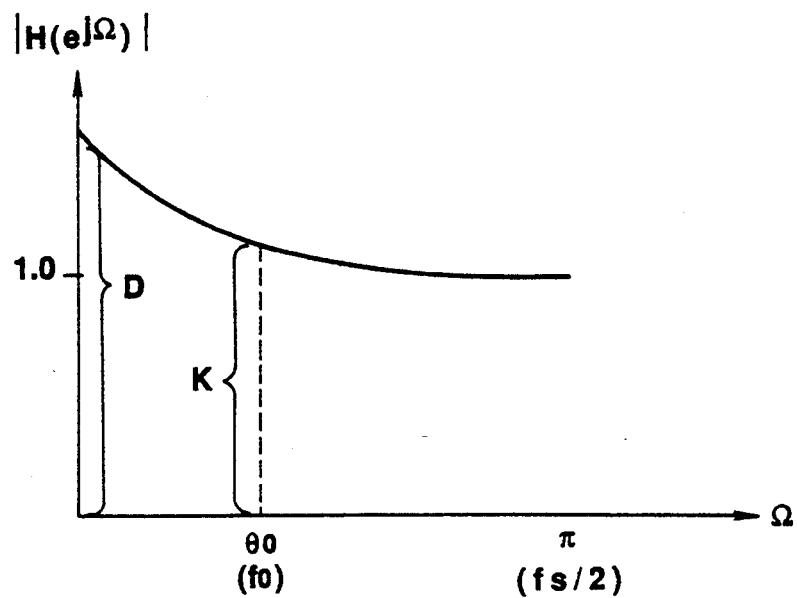

B1 takes the position of B2 and vice versa (refer to FIG. 12). As shown in FIG. 13, the amplitude characteristic $|H(e^{j\Omega})|$ shows a monotonously decreasing tendency with $\pi(=fs/2)=1.0$. The smaller the value of d is made, the larger the decreasing rate of the amplitude characteristic becomes. The filtering characteristic (frequency vs. amplitude characteristic) of the digital filter is shown in FIG. 13. The amplitude characteristic takes a value of K at the frequency $\Omega=\theta o(=fo)$ and the amplitude characteristic takes a value of D at the frequency $\Omega=0$. Therefore, the digital filter 11 will operate as a high-pass filter, as shown in FIGS. 10 and 13 in accordance with the polar, the zero point, the frequency fo and the distance d. The digital filter 11 has such a characteristic as shown in FIGS. 10 and 13 for specific parameters and these parameters will be calculated as described below.

Now, we define the amplitude characteristic $|H(e^{j\Omega})|$ as $|H(e^{j\Omega})|_{\Omega=0}=D$ at $\Omega=0$ (i.e., f=0) from relations of coefficients B1, B2, K to fo and D. Then, $$|H(e^{j\Omega})|_{\Omega=0}=K(1-B2)/(1-B1)=D$$

$$(1+B1)/(1+B2)\times(1-B2)/(1-B1)=D=1/g \quad (22)$$

Substituting B1=C−d, B2=C+d (expression (2)) to the expression (22), we obtain $$[1+(C-d)]/[1+(C+d)]\times[1-(C+d)]/[1-(C-d)]\\=1/g \quad (23)$$

Now, we obtain $$d=[(g+1)\pm\{(g+1)^2+(g-1)^2(C^2-1)\}^{\frac{1}{2}}]/(g-1) \quad (24)$$

When
$A=(g+1)/(g-1)=(1/D+1)/(1/D-1)=(1+D)/(1-D)$, then we obtain $$d=A\pm\{A^2+C^2-1\}^{\frac{1}{2}} \quad (25)$$

Such a solution of d as satisfies a condition $|d|<1$ is selected from the above two solutions.

Now, it will be apparent from the above mentioned, that, when the frequency fo and the gain G [dB] is set, the coefficients B1, B2 and K will be calculated from the following expressions. Once values of the coefficients B1, B2 and K are obtained, a digital filter may be realized which has a function of processing signals in a digital fashion, similarly to a high-pass filter.

C=cos (2 πfo/fs)
d=A±{A²+C²−1}^½, where |d|<1
A=(1+D)/(1−D)
D=10^{G[dB]/20}
B1=C−d
B2=C+d
K=(1+B1)/(1+B2)

When the frequency fo and the gain G have been decided as described above, the coefficients B1, B2 and K for operation of a high-pass filter are different from those for operation of a high-pass filter only in the above A and K. Therefore, for making the digital filter operate as a high-pass filter, not so many data are required to be stored on a table such as ROM. For example, some coefficients such as B1, B2 previously memorized in ROM will be enough for operation of any type of filters, because other coefficients may be set appropriately for the purpose.

FIGS. 14 to 17 are views for explaining the characteristics of the digital filter which operates on the basis of the above mentioned fundamental principle. FIGS. 14A and 14B are views for explaining the digital filter, which performs operations similar to a low-pass filter. FIGS. 15A and 15B are views for explaining the digital filter, which performs operations similar to a high-pass filter. FIGS. 16A and 16B, and FIGS. 17A and 17B are views showing the digital filters respectively, which comprise the above two filters cascade-connected to each other and operating as a band-pass filter.

Figure 14A:
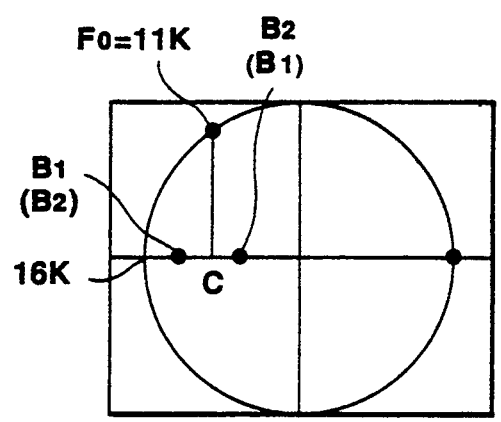
FIGS. 14A and 14B are views showing a frequency characteristic for explaining the effects of the digital filter which operates as a low-pass filter.
Figure 14B:
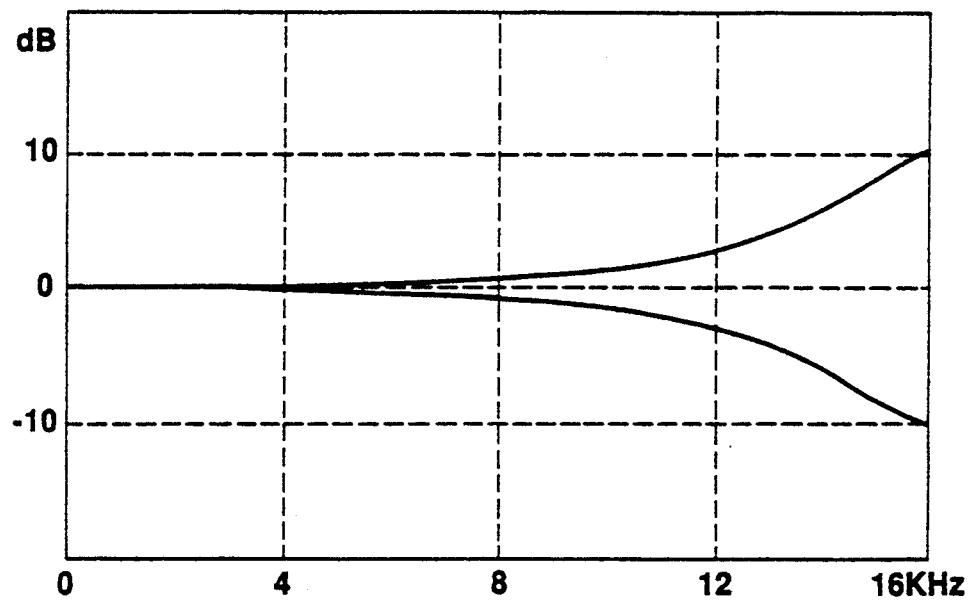

As shown in FIG. 14A, assuming that the amplitude characteristic expressed by the unit circle, $H(e^{j\Omega})=1.0$ (=0 [dB]), the gain G=+10 dB, and the frequency $\Omega=0$, expressed on the unit circle, is 0 KHz, the frequency π=16 KHz at the gain=G, and an normalization is effected with 0 Hz (Z=1) at the frequency Fo of the intersection 11 KHz, then the constant K is determined from the expression (7) by setting B1 and B2 to appropriate values, respectively. Consequently, a digital filter is realized which operates as a low-pass filter having the filtering characteristic shown in FIG. 14B. As will be apparent from the filtering characteristic of FIG. 14B, the varying rate of the transmission characteristic $H(e^{j\Omega})$ of the digital filter changes in an increasing direction as well as in a decreasing direction. In addition, an attenuating or increasing rate of the transmission characteristic may be changed without any limitation by setting the coefficients K, B1 and B2 to appropriate values.

In the above description, D and the gain G are expressed by the following relation:

$$G^{[dB]}=20\log_{10}D \quad (31)$$

Figure 15A:
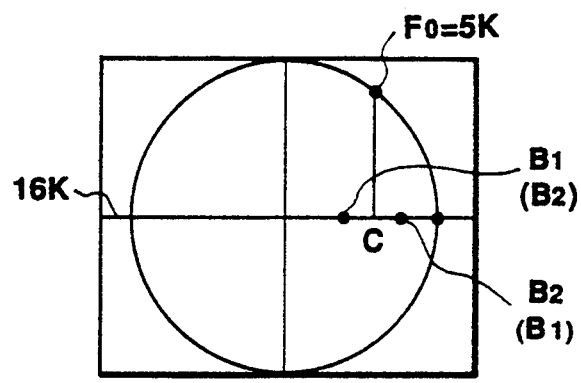
FIGS. 15A and 15B are views showing a frequency characteristic for explaining the effects of the digital filter which operates as a high-pass filter.
Figure 15B:
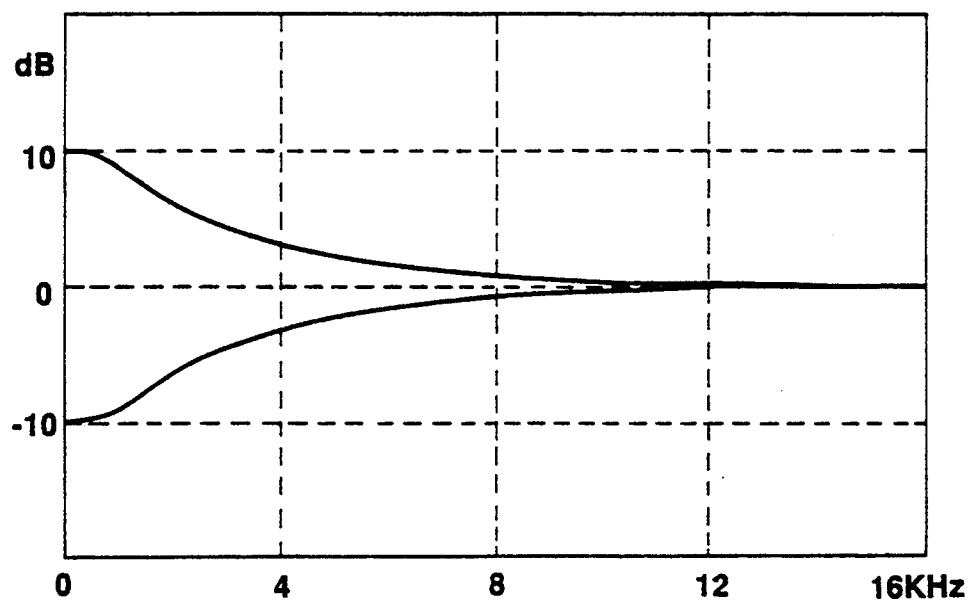

As shown in FIG. 15A, in case that the frequency fo at the intersection is 5 KHz and the normalization is effected with 16 KHz (Z=−1), then the constant K is determined from the expression (21) by setting B1 and B2 to appropriate values, respectively and a filter shown in FIG. 15B is realized which operates as a high-pass filter. Similarly as in FIG. 14B, the varying rate of the transmission characteristic $H(e^{j\Omega})$ of the filter changes in an increasing direction as well as in a decreasing direction. In addition, an attenuating or increasing rate of the transmission characteristic may be changed without any limitation by setting the coefficients K, B1 and B2 to appropriate values, respectively.

Figure 16A:
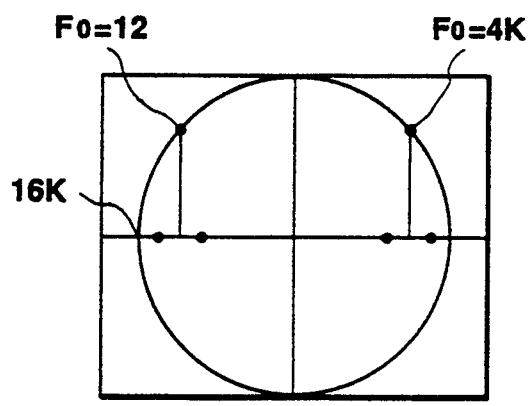
FIGS. 16A and 16B are views showing a frequency characteristic for explaining the effects of the digital filter which operates as a band-pass filter.
Figure 16B:
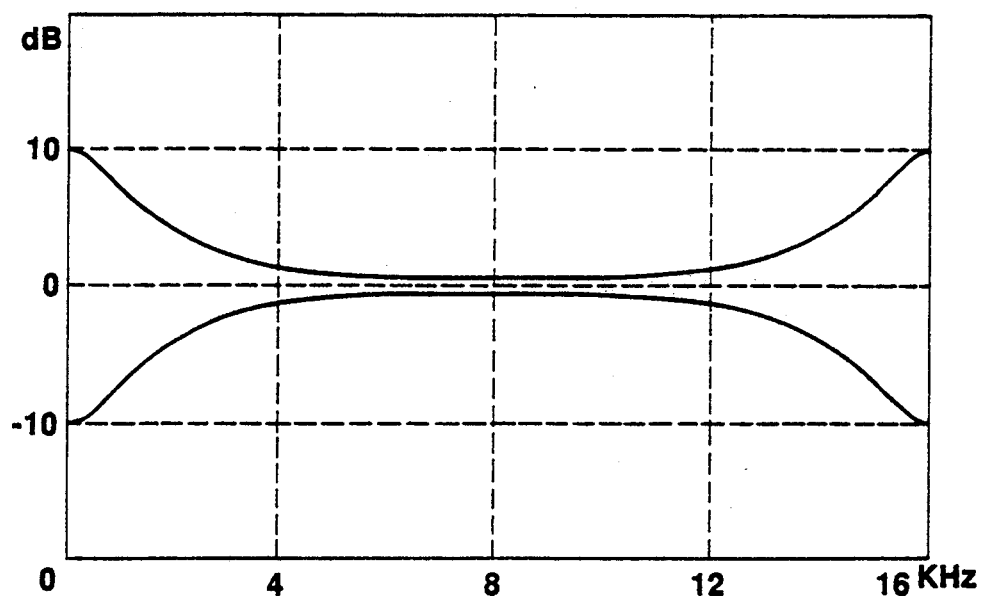

When, as shown in FIG. 16A, the frequency fo at the intersection for the low-pass filter of FIG. 14 (the first filter) is set to 12 KHz and the normalization is effected with 0 Hz (Z=1), and the frequency fo at the intersection for the high-pass filter of FIG. 15 (the first filter) is set to 4 KHz and the normalization is effected with 16 KHz (Z=−1), a cascade connection of the first filter and the second filter will constitute a band-pass filter which shows a filtering characteristic involving respective characteristics of the filters. As described above, the band-pass filter is realized by the cascade connection of a low-pass filter and a high-pass filter but the band-pass filter may be also realized by a time sharing technique, i.e., the band-pass filter may be realized by substituting values of the coefficients K, B1 and B2 every sampling period in a time sharing fashion. This technique allows the band-pass filter to be composed of less number of components.

Figure 17A:
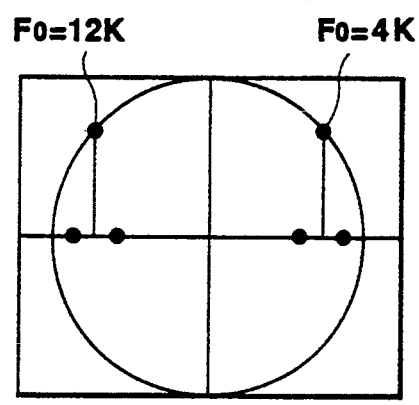
FIGS. 17A and 17B are views showing a frequency characteristic for explaining the effects of the digital filter which operates as another low-pass filter.
Figure 17B:
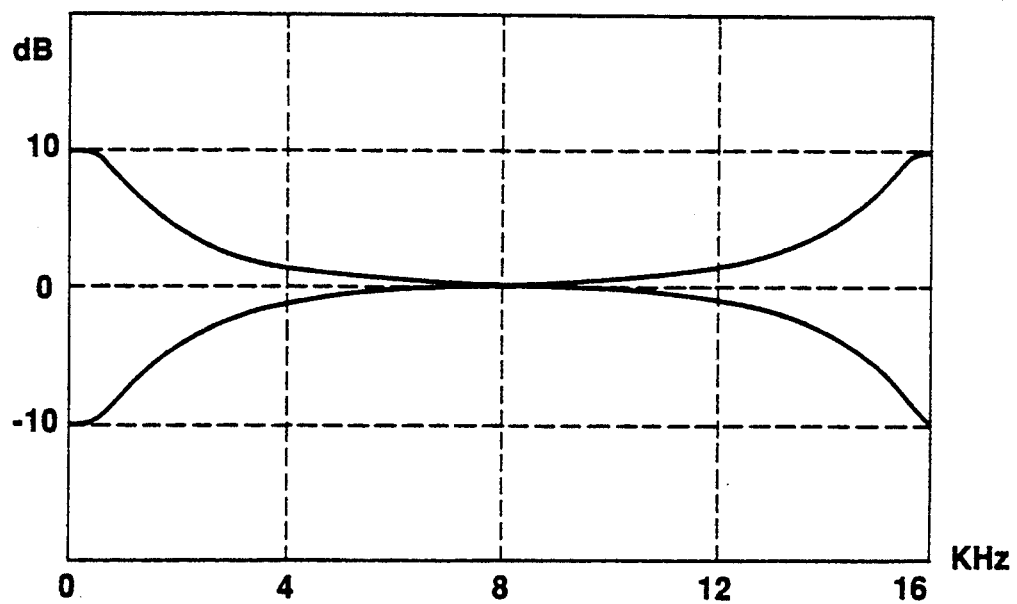

When, as shown in FIG. 17A, the gain of the first filter is set to ±10 dB, the frequency fo at the intersection is set to 12 KHz and the normalization is effected with 0 Hz (Z=1), and the gain G of the second filter is set to ±10 dB, the frequency fo at the intersection is set to 4 KHz and the normalization is effected with 16 KHz (Z=−1), a band-pass filter shown in FIG. 17B will be realized.

Application of the Filter to an Electronic Musical Instrument

Now, an embodiment of an electronic musical instrument to which the above filter device is applied will be described hereafter.

FIGS. 18 to 29 are views showing an embodiment of an electronic musical instrument to which the filter device according to the invention is applied. An embodiment of the electronic musical instrument will be described, which employs the digital filter, the principle of which has been described above, for changing tone color of musical tones in response to performance data such as sound intensity, sound pitches and variations of data from a keyboard.

Figure 20:
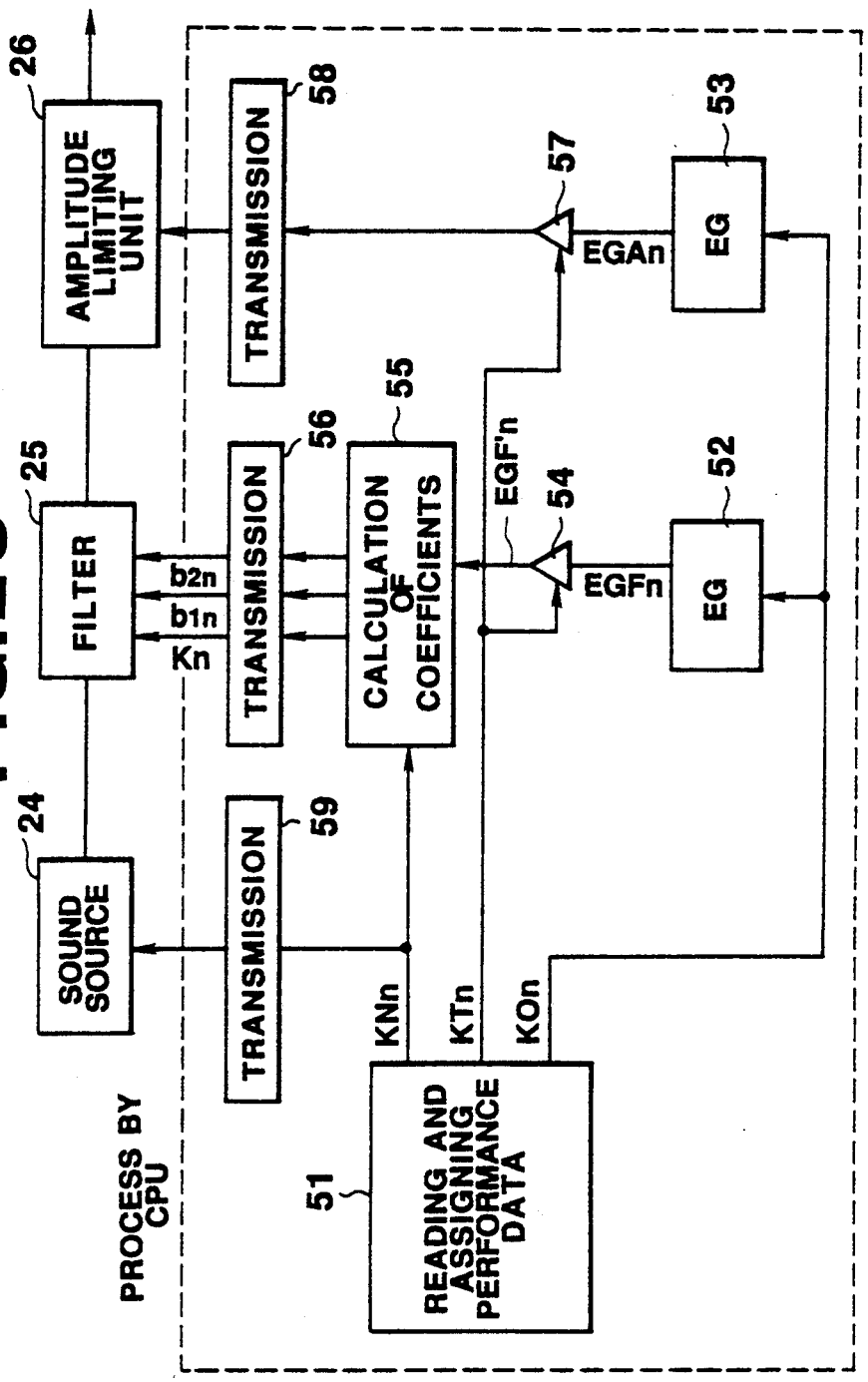

The configuration of the electronic musical instrument will be described. FIGS. 18 to 20 are views showing a whole configuration of the electronic musical instrument using the digital filter. FIG. 18 is a block diagram of a whole configuration of the electronic musical instrument 21 using the digital filter. The electronic musical instrument 21 of FIG. 18 comprises a keyboard 22 for supplying performance data such as tone pitch data (KN), touch data (KT) and keyboard data (KO), data processing unit 23 for performing operation on the supplied performance data (KN, KT, KO) to generate control data, a sound source 24 having a plurality of channels (for example, 10 channels or 16 channels), for generating waveform signals representing the musical scales corresponding to the channels respectively, a digital filter 25 for performing filtering operation on the waveform signals of the channels of the sound source 24 in a time sharing fashion to process sound signals from the sound source 24, an amplitude limiter 26 for limiting amplitudes (controlling envelopes) of the waveform signals each representing a musical scale, the waveform signals being added with harmonics by the digital filter 25, and a mixer 27 for mixing all of the waveform signals of the channels each having an amplitude limited by the amplitude limiter 26.

FIG. 19 is a view showing a detailed configuration of the electronic musical instrument 21. In FIG. 19, a reference numeral 31 stands for CPU for controlling the whole system, and for processing various data (timer-1 processing to timer-4 processing). CPU 31 controls various operations of the electronic musical instrument 21 in accordance with a program stored in ROM 33. CPU 31 is connected through an internal bus 32 with ROM 33 for storing a program for CPU 31, RAM for temporarily storing data used for operation and results of the operation, a digital signal processor (hereafter, referred to as "DSP") 35 having a digital filter function, ROM 36 for storing various coefficients of the digital filter such as kn, b1n, b2n (n stands for a sounding channel), a keyboard 37, a sound source 38, switches 39, an A/D converter 41 and a D/A converter 43.

The keyboard 37 has a plurality of keys each for designating a tone pitch of a musical tone to be generated. The sound source 38 generates musical tone signals through a plurality of sounding channels by a linear or non-linear synthesizing technique in accordance with sound pitches designated by the keyboard 37. The switches include operators for selecting tone color of musical tones to be generated, pitch-bend operators and the like. The A/D converter 41 converts an analog signal output from a detection circuit 40, representing touch intensity applied to the keys of the keyboard 37 into a digital signal. The D/A converter 43 converts a produced musical tone signal into an analog signal and supplies the analog signal to a sounding circuit 42.

Under control of an operation program, DSP 35 performs a digital-filter function depending on the principle described above by using the coefficients (kn, b1n and b2n) stored in ROM 36. In this case, CPU 31 reads out coefficient data (kn, b1n and b2n) from ROM 36 and calculates pertinent coefficients corresponding to touch intensity applied to the keys of the keyboard 37. The coefficients calculated thus are supplied to DSP 35.

The keyboard 37 serves to generate performance data such as tone pitch data (key note) KNn of keys corresponding to the plurality of sounding channels (n), key touch data KTn representing touch intensity and key data KOn representing ON/OFF of the key. The tone pitch data Knn and the key data KOn are supplied to CPU 31 through the internal bus 32. The key touch data KTn representing touch intensity is detected by the detection circuit 40 and is converted into digital data by the A/D converter 41 and then supplied for example to CPU 31. In the present embodiment, the keyboard 37 is used as operators for generating performance data, but benders and pedals may be used in addition to the keyboard 37 or in place of the keyboard 37 for generating performance data.

The sound source 38 includes a plurality of sounding channels (n) which are capable of generating independently musical tone signals. The sound source 38 receives tone-pitch data KNn assigned to respective sounding channels from CPU 31 and each sounding channel generates a musical tone signal on the basis of the assigned tone-pitch data. Using PCM technique, non-linear synthesizing operation or sinusoidal signal synthesizing operation, the sound source 38 generates signals each having a predetermined waveform.

When, for example, a player touches a key of the keyboard 37, CPU 31 assigns instantly the sound source 38 tone-pitch data corresponding to the touched key, causing it to generate a musical tone of a tone pitch corresponding to the touched key. In this case, the sound source 38 may generate a musical tone of a tone pitch slightly shifted from the original tone pitch or may generate a musical tone out of tune. CPU 31 may be arranged to store data from the keyboard 37 as sequential data and to read out the stored sequential data in response to a play-start instruction supplied from the keyboard, generating pertinent musical tone signals.

The sounding circuit 42 is a sound system for audibly generating musical tone signals, i.e., for audibly generating analog musical tone signals converted by D/A converter 42.

FIG. 20 is a block diagram of functions performed by CPU 31. A coefficient calculating process of FIG. 20 will proceed under control of the program (timer-1 process to timer-4 process) as shown in FIGS. 24 to 27. FIG. 20 is a block diagram showing the data processing unit 23 of FIG. 18 in detail. In FIG. 20, CPU 31 reads performance data from the keyboard 37 such as tone pitch data KNn, key touch data KTn and key data KOn and de&ides the musical scale to be assigned to a musical tone (at a reference numeral 51). The key data KOn representing ON/OFF of the key is supplied to an envelop generators (EG) 52, 53. The envelop generator 52 calculates a filter envelop EGFn on the basis of the supplied key data K0n. A multiplier 54 modifies the filter envelope EGFn to a value EGFn' corresponding to the key touch data KTn and supplies the same to the coefficient calculating process 55. To the coefficient calculating process 55 the tone pitch data KNn is further inputted, and coefficients kn, b1n and b2n are calculated on the basis of these input data and are transferred to the digital filter 25 comprising DSP 35 (at a reference numeral 56). More specifically, in the coefficient calculating process 55 CPU 31 calculates the coefficients kn, b1n and b2n from the envelop data EGFn' concerning key touch and a frequency fo depending on the tone pitch data KNn, and transfers these calculated coefficients to DSP 35 for processing musical tones. Using the above coefficients kn, b1n and b2n, the digital filter 25 involving DSP 35 works in accordance with the controlling flow chart of FIG. 28, performing the functions every sampling periods based on the principle described above. The digital filter 25 processes signals of a specific level supplied from the sound source 24 and supplies the processed signals to an amplitude limiting unit 26.

Meanwhile, the envelop generator 53 calculates an envelop EGAn for limiting amplitude of a signal and a multiplier 57 multiplies the envelop EGAn by the key touch data KTn and transfers the resultant to the amplitude limiter 26 (at a reference numeral 58). The tone pitch data KNn is transferred to the sound source 24 without being subject to any modification (at a reference numeral 59).

Figure 21:
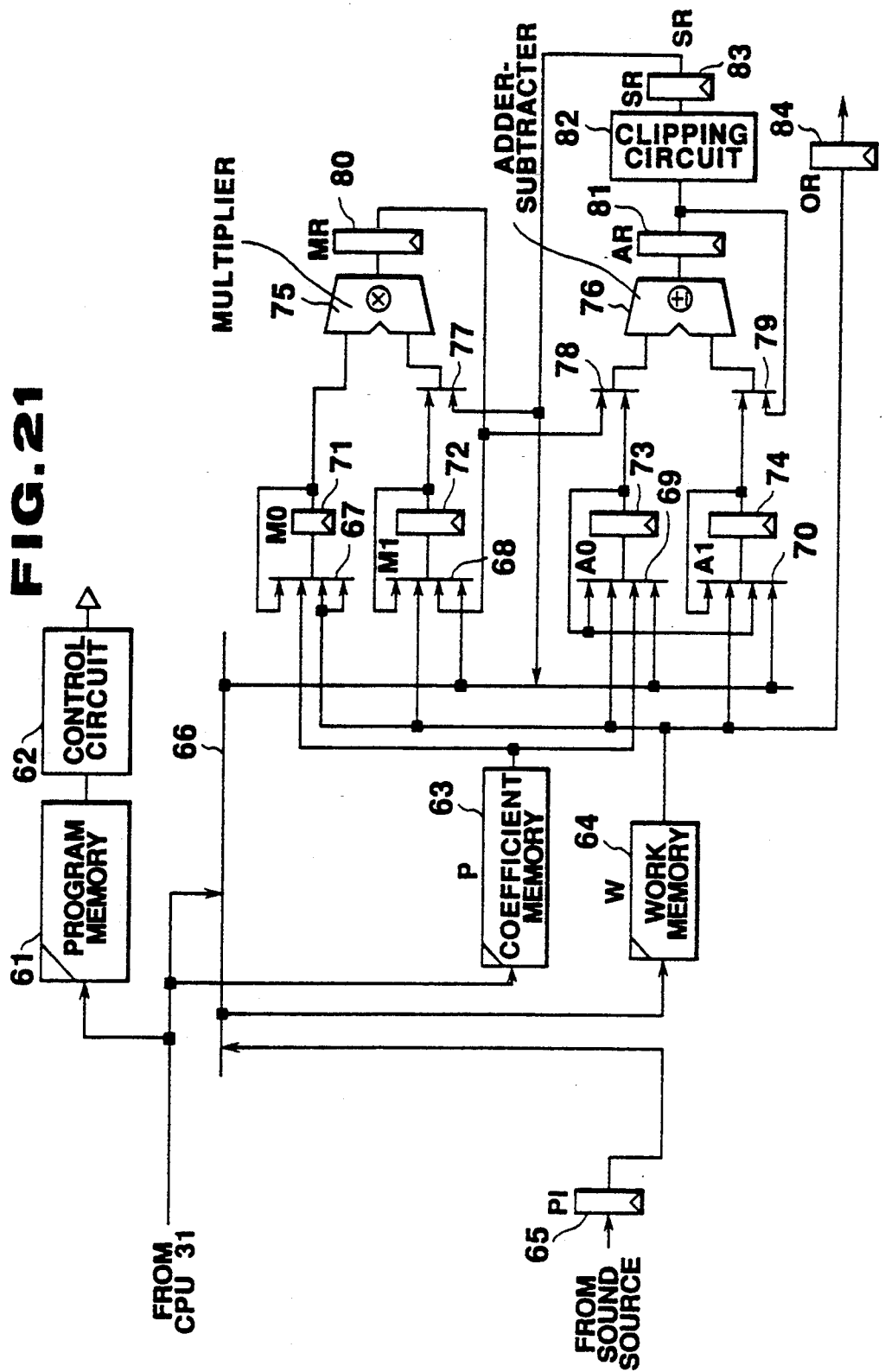

FIG. 21 is a view showing an internal configuration of DSP 35. In FIG. 21, a program memory 61 is a memory for storing a program and supplies an operation program to a control circuit 62 under an instruction from CPU 31. The program memory 62 is connected with an address counter (not shown) and successively supplies the control circuit 62 with contents of the program addressed by the address counter. Under control of the program supplied from the program memory 61, the control circuit 62 controls transmission of data between registers and memories, further controls operations on data, and supplies gates and latches with various control signals for ON/OFF control, effecting various processes of signals in a desired manner.

A coefficient memory (P) 63 is a register to store a plurality of coefficients kn, b1n and b2n, which correspond to the sounding channel (n), and which are used for obtaining a desired digital filter as shown in FIG. 22. CPU 31 reads out these coefficients kn, b1n and b2n from ROM 36 supplies them to the coefficient memory (P) 63. A work memory (W) 64 serves to temporarily store waveform signals generated within DSP 35, as will be described later with reference to FIG. 23. An input register (PI) 65 stores digital-signal data input from the sound source 24 and supplies various sections through an internal bus 66.

Output data of the coefficient memory (P) 63 and the work memory (W) 64, and output data of the input register (PI) 65 are supplied to gate terminals of gates 67 to 70 together with output data from register, which will be described later. Output data from the gates 67 to 70 are supplied to registers (MO) 71, (M1) 72, (A0) 73 and (A1) 74, respectively. The registers (M0) 71 and (M1) 72 store data in process of operation to be supplied to a multiplier 75. The registers (A0) 73 and (A1) 74 store data in process of operation to be supplied to an adder-subtracter 76. The output data of the register (M1) 72 and a register (SR) 83 are supplied to the multiplier 75 through the gate 77. The output data of the register (A0) 73 and a register (MR) 80 are supplied to the adder-subtracter 76 through the gate 78 and at the same time the output data of the register (A1) 74 and a register (AR) 81 are supplied to the adder-subtracter 76 through the gate 79. The resultant product of the multiplier 75 is stored in the register (MR) 80 and the output data of the register (MR) 80 is supplied to the gates 68 and 78. The resultant of the adder-subtracter 76 is stored in the register (AR) 81, and the output data of the register (AR) 81 is supplied to the gate 79 and also to the register (SR) 83 through a clipping circuit 82 for preventing overflow. The output data of the register (SR) 83 is supplied to the gate 77, and also to the work memory (W) 64 through the internal bus 66 as a result of a series of operations on one musical tone.

When the resultants of the above operations have been stored in the work memory (W) 64 and a series of processes have been finished, data stored in the work memory (W) 64 are transferred to an output register (OR) 84. The output register (OR) 84 outputs the received data to the amplitude limiter 26.

FIG. 22 is a view showing an internal configuration of the coefficient memory (P) 63. A coefficient k0 corresponding to the constant K for the sounding channel 0 (if, for example, there are provided eight sounding channels, the sounding channel 0 corresponds to the least significant channel) is stored at address 00, a coefficient b10 corresponding to the coefficient B1 for the sounding channel 0 is stored at address 01 and a coefficient b20 corresponding to the coefficient B2 for the sounding channel 0 is stored at address 02. A coefficient k1 corresponding to the constant K for the sounding channel 1 is stored at address 03, a coefficient b11 corresponding to the coefficient B1 for the sounding channel 1 is stored at address 04 and a coefficient b21 corresponding to the coefficient B2 for the sounding channel 1 is stored at address 05. Similarly, a coefficient kn corresponding to the constant K for the sounding channel n (if, for example, there are provided eight sounding channels, the sounding channel n corresponds to the most significant channel) is stored at address 3n, a coefficient b1n corresponding to the coefficient B1 for the sounding channel n is stored at address 3n+1 and a coefficient b2n corresponding to the coefficient B2 for the sounding channel n is stored at address 3n+2. In this manner, n sets of coefficients kn, b1n and b2n for n units of sounding channels are prepared and stored in the coefficient memory (P) 63 to obtain the above digital filter 11. If, for example, there are provided eight sounding channels (which allow eight musical tones at the maximum to be sounded at the same time), eight sets of the coefficients kn, b1n and b2n have to be prepared for one key-tone of the keyboard 37. Hence, a register for storing eight sets of coefficients is required, and memory areas for storing eight sets of coefficients are required in the work memory (W) 64, too.

CPU 31 reads out the coefficients kn, b1n and b2n stored in the coefficient memory (P) 63 from the coefficient ROM 36 and transfers to the coefficient memory (P) 63 of DSP 35. As described above, the coefficient memory (P) 63 holds several sets of coefficient data and the number of sets of coefficient data is equivalent to the number of the sounding channels. The coefficients K, B1 and B2 defined by the frequency fo and the gain G are previously calculated and memorized in a table of the coefficient ROM 35. CPU 31 reads out the coefficients memorized in a pertinent table on the basis of the characteristic of the filter to be realized and data from the keyboard 37 (key touch data), and writes the read out coefficients in the coefficient memory (P) 63 of DSP 35.

In FIGS. 21 and 22, the processes with respect to one tone have been explained by way of an example but the processes in practice can be performed in a time-sharing multiplex fashion (for example, in case that key touch is different and different coefficients are used).

To realize digital filters of various characteristics, not only coefficients are selected from those previously memorized in the coefficient ROM 36 but also desired coefficients may be calculated from a function previously memorized.

FIG. 23 is a view showing the internal configuration of the work memory (W) for storing data in process of operation. Data Z0 corresponding to the content of a delaying element for the sounding channel 0 is stored at address 00, and output data OT0 corresponding to the content of the filter output for the sounding channel 0 is stored at address 01. Data Z1 corresponding to the content of the delaying element for the sounding channel 1 is stored at address 02 and output data OT1 corresponding to the content of the filter output for the sounding channel 1 is stored at address 03. Similarly, data Zn corresponding to the content of the delaying element for the sounding channel n is stored at address 2n, output data OTn corresponding to the content of the filter output for the sounding channel n is stored at address 2n+1.

Now, operation of the present embodiment will be described.

Operation of CPU 31 for Processing Data

Operation of CPU 31 for processing data will be described with reference to FIGS. 24 to 27.

Figure 24:
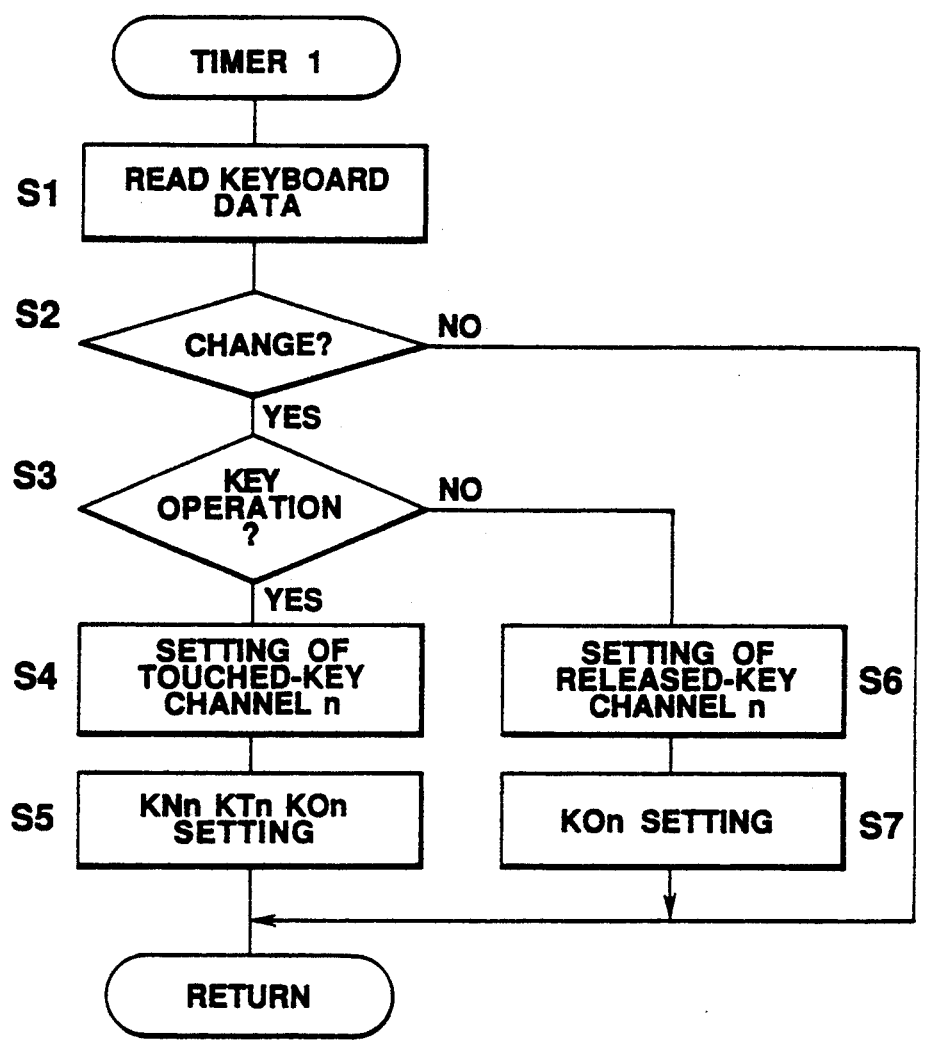

FIG. 24 is a flowchart of the timer-1 process for assigning performance data KNn, KTn and KOn depending on keyboard data. Operation of this flowchart corresponds to the function shown at the reference numeral 51 of FIG. 20. In FIG. 24, numerals Sn (n=1, 2, ...) stand for steps of the operation shown in FIG. 24.

At step S1, CPU 31 reads keyboard data and judges at step S2 if there has been made any change in the keyboard data. If CPU 31 has judged that no change has been made in the keyboard data, CPU 31 finishes the operation. If CPU 31 has judged that there has been made a change in the keyboard data, CPU 31 goes to step S3, where it judges if the change has been made by a key-touch operation. If CPU 31 judges that the change in the keyboard data has been made by a key-touch operation, then CPU 31 goes to step S4, where CPU 31 Judges which key of the keyboard 37 has been touched and sets a touched-key channel n for the touched key. At step S5, CPU 31 sets tone pitch data KNn, touch data KTn, and touched-key data KOn generated by the key-touch operation, finishing an assigning process.

Meanwhile, if CPU 31 judges that the change in the keyboard data has not been made by a key-touch operation, CPU 31 judges that the change has been made by a key-release operation and goes to step S6. CPU 31 sets at step S6 a released-key channel n, and goes to step S7. At step S7, CPU 31 sets touched-key data KOn representing a key release to the released-key channel n, finishing a setting process.

Figure 25:
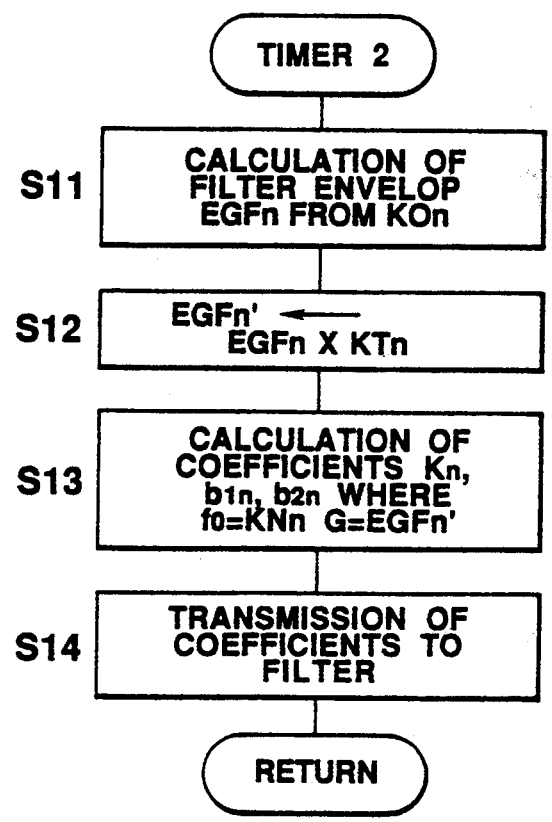

FIG. 25 is a flowchart showing a timer-2 process for calculating coefficients kn, b1n and b2n. This flow chart shows the process from the envelope generation 52 to the transmission 56 of FIG. 20.

At step S11, CPU 31 calculates a filter envelop EGFn from the touched-key data KOn, and at step S12 multiplies the calculated filter envelope EGFn by KTn, obtaining a filter envelope EGFn' corresponding to the key touch (EGFn'←EGFn×KTn). At step S13, CPU 31 calculates the coefficients kn, b1n and b2n using the key data KNn as the frequency fo (Fo=KNn) and the envelope EGFn' as the gain G (GAIN=EGFn'). In the present embodiment, calculation of the coefficients is effected by addressing to read out data stored in the coefficient ROM 36. At step S14, CPU 31 transfers the calculated coefficients kn, b1n and b2n to a filter 25 including DSP 35, finishing the process.

Figure 26:
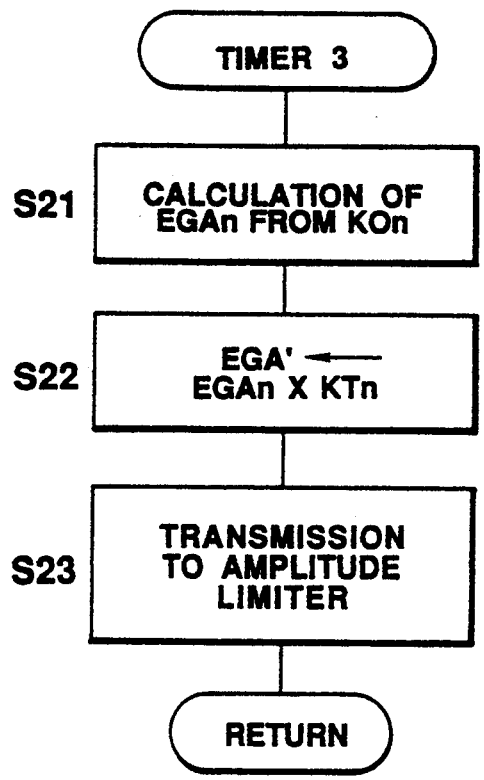

FIG. 26 is a flowchart showing a timer-3 process for calculating the amplifier envelope EGAn. This flowchart shows the process from the envelope generation 53 to the transmission 58 of FIG. 20.

At step S21, CPU 31 calculates the amplifier envelope EGAn from the touched-key data KOn, and at step S22 multiplies the calculated envelop EGAn by KTn, obtaining an amplifier envelop EGA' corresponding to the key-touch data for limiting amplitude (EGA'←EGAn×KTn). At step S23, CPU 31 transfers the calculated amplifier envelope EGA' to the amplitude limiter 26 including DSP 35, finishing the process.

Figure 27:
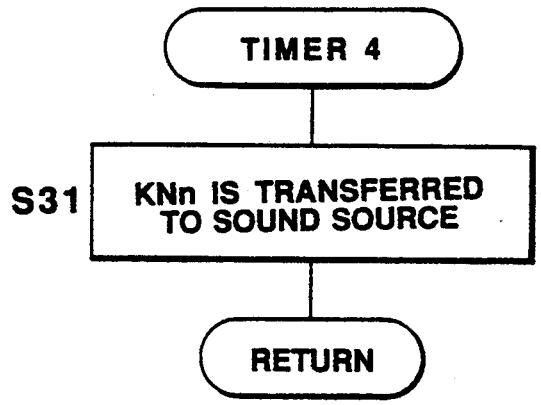

FIG. 27 is a flowchart of a timer-4 process for transferring tone-pitch data KNn to the sound source. The timer-4 process corresponds to transmission 59 of FIG. 20.

Since a value previously determined from frequency data corresponding to tone-pitch data KNn is generated, the tone-pitch data KNn is transferred to the sound source 24 without any modification and the timer-4 process is finished at step S31.

Filter Operation of DSP 35

Figure 28:
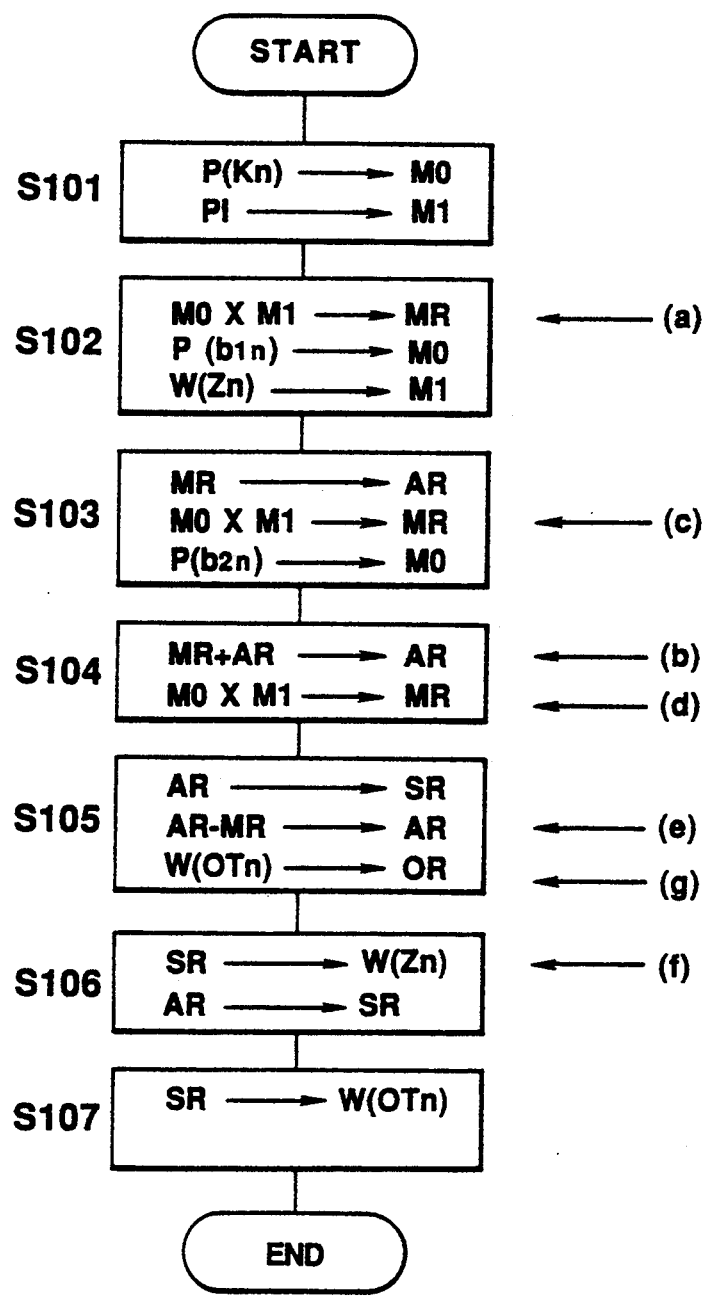
Figure 29:
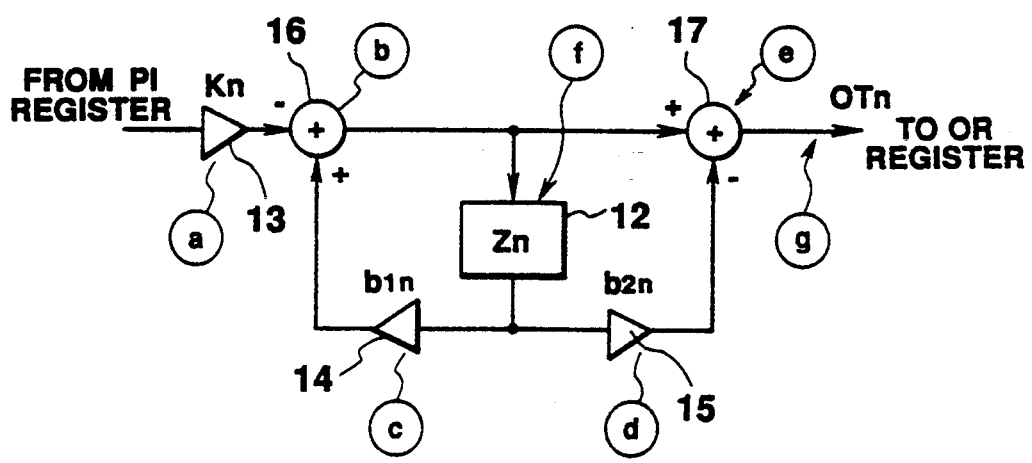
Figure 30:
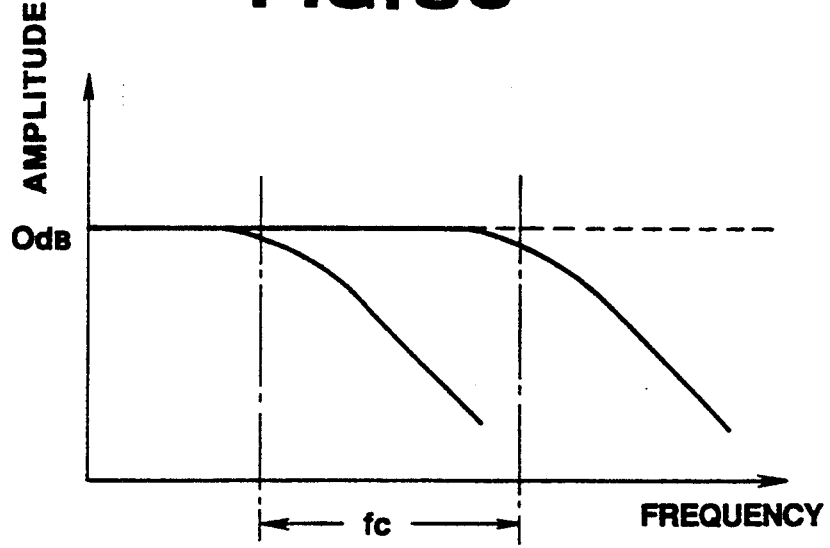
FIG. 30 is a view showing a frequency characteristic for explaining a cut-off frequency fc in a conventional low-pass filter.

FIG. 28 is a flowchart of operation for one channel of the digital filter 25 involving DSP 35. This flowchart represents processes preformed under a program stored in the program memory 61 of DSP 35. DSP 35 of FIG. 21 performs the processes in accordance with the flowchart of FIG. 28, realizing the first-stage digital filter 11 shown in FIG. 29. Reference symbols (a) through (f) of FIGS. 28 and 29 represent states in process, respectively.

At step S101, DSP 35 reads out a coefficient kn from the coefficient memory (P) 63 and sets the coefficient kn to the register (M0) 71 (P(kn)→M0) and also sets input waveform in the register (PI) 65 to the register (M1) 72 (PI→M1). At the following step S102, a value of the register (M0) 71 to which the coefficient kn has been set at step S102 is multiplied by a value of the register (M1) 72 to which the input waveform has been set, and the product is set to the register (MR) 80 (M0×M1→MR). Further, DSP 35 reads out a coefficient b1n from the coefficient memory (P) 63 and sets the same to the register (M0) 71 (P(b1n)→M0), and also reads out the result of the operation Zn obtained previously from the work memory (W) 64 and sets the same to the register (M1) 72 (W(Zn)→M1). In the multiplication process of FIG. 29, the input waveform supplied to the multiplier 13 from the register (PI) 65 is multiplied by the coefficient kn (refer to (a) of FIGS. 28 and 29). When the product is stored in the register (MR) 80 (M0×M1→MR), the coefficient b1n for feedback multiplication and the result Zn of the previous operation output from the delaying element 12 are stored in the registers (M0) 71 and (M1) 72, respectively. At step S103, DSP 35 transfers a value set in the register (MR) 80 to the register (AR) 81 (MR→AR) and multiplies the value of the register (M0) 71 to which the coefficient b1n has been set by the value of the register (M1) 72 to which the result Zn of the previous operation has been set, and sets the product to the register (MR) 80 (M0×M1→MR). Further, DSP 35 reads out one other coefficient b2n from the coefficient memory (P) 63 and sets the coefficient b2n to the register (M0) 71 (P(b2n)→M0). More specifically, a value of the register (MR) 80 to which the product has been set is transferred to the register (AR) 81 for the following multiplication and then the multiplier 14 is allowed to multiply the output Zn (the result of the previous operation) of a previous sampling period from the delaying element 12 by the coefficient b1n as shown at (c) in FIG. 29. At step S104, a value of the register (MR) 80 to which the product of the coefficient b1n and the result Zn of the previous operation have been set is added with a value of the register (AR) 81 and the sum is set to the register (AR) 81 (MR+AR→AR). The value of the register (M0) 71 to which the coefficient b1n is multiplied by the value of the register (M1) 72 and the product is set to the register (MR) 80 (M0×M1→MR). As a result, the adder 16 is allowed to add the product of the input waveform and the coefficient kn to the product supplied from the multiplier 14 of the coefficient b1n and the result Zn of the previous operation as shown at (b) in FIGS. 28 and 29, and also the multiplier 15 is allowed to multiplies the result Zn of the previous operation by the coefficient b2n as shown at (d). At step S105, a value set to the register (AR) 81 is transferred to the register (SR) 83 (AR→SR) and a value of the register (MR) 80 in which the product of the coefficient b2n and the result Zn of the previous operation has been stored is subtracted from a value of the register (AR) 81 and the difference is set to the register (AR) 81 (AR−MR→AR). Further, an output data stored in the work memory (W) 64 in the previous process is output to the output register (OR) 84 (W(OTn)→OR). More specifically, the adder 17 is allowed to subtract the product (output of the multiplier 15) of the coefficient b2n and the result Zn of the previous operation from the value supplied to the adder itself as shown at (e) of FIGS. 28 and 29, and also to transfer the difference to the output register (OR) 84 as shown at (g) of FIGS. 28 and 29. At step S106, a value of the register (SR) 83 is written at a pertinent address in the work memory (W) 64 as data Zn corresponding to the content of the delaying element 12 (SR→W (Zn)) and a value of the register (AR) 81 is transferred to the register (SR) 83 (AR→SR). As a result, a process shown at (f) of FIG. 29 shall be performed. At step S107, a value set to the register (SR) 83 by the above operation is written at a corresponding address in the work memory (W) 64 as output data OTn corresponding to the content of the filter output (SR→Y W(OTn)), and the present operation is finished. Then DSP 35 returns to the step S101 and repeats the similar operation for another sampling period.

As described above, DSP 35 performs a filtering operation every sampling period on the basis of the coefficients K, B1 and B2 calculated in accordance with the fundamental principle in a time sharing fashion, and further more DSP 35 repeatedly performs the filtering operation for respective tone scale so that input signals shall be subject to a real-time processing.

In the present embodiment described above, in accordance with performance data KN, KTn and KOn from the keyboard 37 musical tone signals generated by the sound source 24 are subjected to a filtering operation on the basis of the coefficients kn, b1n and b2n defined by gain G for predetermined frequencies and a frequency fo corresponding to a phase at an intersection of the unit circle and a straight line intersecting at right angles a real axis passing a midpoint between a polar and a zero point thereon on Z-plane, and musical tone signals receives harmonic variations and then supplied to the amplitude limiter 26. Therefore, in the electronic musical instrument, not only cut-off frequency in the musical tone signal is changed but also gain in cut-off and amplitude range can be varied. The electronic musical instrument according to the invention produces musical tones involving various harmonics, which are almost equivalent to those as an acoustic instrument produces, in accordance with the performance data input thereto. Further, the electronic musical instrument allows the player to make a wide variety of musical tones.

An example of an electronic musical instrument to which the filter device according to the invention has been described but the application of the filter device is not limited to a musical instrument. The filter device of the invention may be used in various types of apparatus in which a digital filter is used. For example, the filter device may be used in digital signal processing apparatus and audio systems and also the filter device may be used as a unit independently of other apparatus. The filter device may be used not only in a filtering section of a musical instrument but also may be used as its sound source.

The primary-feedback digital filter which includes any type of the primary-feedback digital filter 11 as shown in FIG. 1 may be used in the present embodiment. For example, a higher order of feedback digital filter may be also used which exhibits a function of the primary-feedback digital filter under control of a program. Even though including a different number of delaying elements at different positions, a circuit provided with at least a portion of the primary-feedback digital filter may be used as the filter device of the present invention.

In the present embodiment, the coefficients K, B1 and B2 which are previously calculated or obtained by a experiment are assigned in accordance with the performance data, but these coefficients may be calculated from a function. Data previously set in a memory may be used as the coefficients. Gain of the digital filter may be varied in time by LFO, a pedal and a bender or may be varied in accordance with an envelope to be obtained. In this manner, the electronic musical instrument involving the above described digital filter may produce musical tones having a wide variety of characteristics. For the best result, it is recommended to make the frequency fo equivalent to the fundamental tone-pitch of the musical tone to be generated.

While the invention is thus disclosed, and the preferred embodiment described in detail, it is not intended that the invention be limited to the shown embodiment. Instead, many modifications will be occur to those skilled in the art which lie within the spirit and scope of the invention.

What is claimed is:

1. A filtering device comprising:
   frequency setting means for setting a desired frequency from which a transmission characteristic of filtering begins to vary;
   gain setting means for setting a gain at a half frequency of a sampling frequency;
   coefficient calculating means for calculating coefficients B1 and B2 based on the desired frequency set by said frequency setting means and the gain set by said gain setting means; and
   digital filter means for performing a filtering operation on signal data input thereto based on a transmission function defined by the coefficients B1 and B2 calculated by said coefficient calculating means;

wherein said coefficient calculating means calculates a position C on a real axis on z-plane using the desired frequency set by said frequency setting means, calculates distance d from the calculated position C to a polar point and from the position C to a zero point using the position C and the gain set by said gain setting means, and calculates the coefficients B1 and B2 from the following expressions:

$$B1=C-d \text{ and } B2=C+d,$$

and outputs the coefficients B1 and B2 thus calculated.

2. A filtering device according to claim 1, wherein said transmission function is defined by $$H1(Z)=K(1-B2/Z)/(1-B1/Z),$$

where $K=(1-B1)/(1-B2)$, and B1 and B2 are coefficients calculated by said coefficient calculating means.

3. A filtering device according to claim 1, wherein the position C is calculated by said coefficient outputting means from the following expression:

$$C=\cos(2\pi fo/fs)$$

where fs is a sampling frequency, and fo is the frequency set by said frequency setting means.

4. A filtering device according to claim 1, wherein the distance d is calculated by said coefficient calculating means from the following expression:

$$d=A\pm\{A^2+C^2-1\}^{\frac{1}{2}}(|d|<1),$$

where $A=(D+1)/(D-1)$, $D=10^{G1/20}$, and the G1 is the gain set by said gain setting means, and is expressed in units of [dB].

5. A filtering device according to claim 4, wherein the distance d calculated by said coefficient calculating means from the frequency fo and the gain G1 is set negative, and the coefficients B1, B2 are set so as to satisfy a condition $B1>B2$.

6. A filtering device according to claim 4, wherein the distance d calculated by said coefficient outputting means from the frequency fo and the gain G1 is set positive, and the coefficients B1 and B2 are set so as to satisfy a condition $B1<B2$.

7. A filtering device comprising:
frequency setting means for setting a frequency from which a transmission of filtering characteristic begin to vary;
gain setting means for setting a gain at a frequency which is zero;
coefficient calculating means for calculating coefficients B3 and B4 on the basis of the frequency set by said frequency setting means and gain set by gain setting means; and
digital filter means for performing a filtering operation on signal data input thereto on the basis of a transmission function of filtering defined by coefficients B3 and B4 calculated by said coefficient calculating means;
wherein said coefficient calculating means calculates a position C on a real axis on z-plane using the frequency set by frequency setting means, calculates distance d from the calculated position C to a polar point and from the position C to a zero point using the position C and the gain set by said gain setting means, and calculates coefficients B3 and B4 from the following expressions:

$$B3=c-d \text{ and } B4=c+d$$

and outputs the coefficients B3 and B4 thus calculated.

8. A filtering device according to claim 7, wherein said transmission function is given by $$H2(Z)=K(1-B4/Z)/(1-B3/Z)$$

where $K=(1+B3)/(1+B4)$ and B3 and B4 are coefficients calculated by said coefficient calculating means.

9. A filtering device according to claim 7, wherein the position C is calculated by said coefficient calculating means from the following expression:

$$C=\cos(2\pi fo/fs)$$

where fs is a sampling frequency, and fo is the frequency set by said frequency setting means.

10. A filtering device according to claim 7, wherein the distance d is calculated by said coefficient calculating means from the following expression:

$$d=A\pm\{A^2+C^2-1\}^{\frac{1}{2}}(|d|<1),$$

wherein $A=(D+1)/(D-1)$, $D=10^{G2/20}$, and G2 is the gain set by said gain setting means, and is expressed in units of $dB$].

11. A filtering device according to claim 10, wherein the distance d calculated by said coefficient outputting means from the frequency fo and the gain G2 is set negative, and the coefficients B3 and B4 are set so as to satisfy a condition $B3>B4$.

12. A filtering device according to claim 10, wherein the distance d calculated by said coefficient calculating means from the frequency fo and the gain G2 is set positive, and the coefficients B3 an B4 are set so as to satisfy a condition $B3<B4$.

13. A filtering device comprising:
frequency setting means for setting desired first and second frequencies from which a transmission characteristic of filtering begins to vary;
gain setting means for setting first gain at a half frequency of a sampling frequency and a second gain at a frequency which is zero;
coefficient calculating means for calculating first coefficients B1 and B2 on the basis of the first frequency set by said frequency setting means and the first gain set by said gain setting means, and second coefficients B3 and B4 on the basis of the second frequency set by said frequency setting means and the second gain set by said gain setting means; and
digital filter means for performing filtering operation on the same signal data input thereto for two times, once based on a first transmission function of filtering defined by the first coefficients B1 and B2 calculated by said coefficient calculating means, and next based on a second transmission function of filtering defined by the second coefficients B3 and B4 calculated by the said coefficient calculating means;
wherein said coefficient calculating means calculates a position C on a real axis on z-plane using the first frequency set by said frequency setting means, calculates distances d from the calculated position C to a polar point and from the position C to a zero point using the position C and the first gain set by said gain setting means, and calculates the coefficients B1 and B2 from the following expressions:

$$B1 = C - d \text{ and } B2 = C + d,$$

and wherein said coefficient calculating means calculates a position C on a real axis on z-plane using the second frequency set by said frequency setting means, calculates distances d from the calculated position C to a polar point and from the position C to a zero point using the position C and the second gain set by said gain setting means, and calculates the coefficients B3 and B4 from the following expressions:

$$B3 = C - d \text{ and } B4 = C + d,$$

and outputs the coefficients B1, B2, B3 and B4 thus calculated.

14. A filtering device according to claim 13, wherein said first and second transmission functions are given respectively by:

$$H1(Z) = K(1 - B2/Z)/(1 - B1/Z),$$

where $K = (1 - B1)/(1 - B2)$, and B1 and B2 are first coefficients calculated by said coefficient calculating means, and $$H2(Z) = K(1 - B4/Z)/(1 - B3/Z),$$

where $K = (1 + B3)/(1 + B4)$, and B3 and B4 are second coefficients calculated by said coefficient calculating means.

15. A filtering device according to claim 13, wherein the position C is calculated by said coefficient outputting means from the following expression:

$$C = \cos(2\pi fo/fs),$$

where fs is a sampling frequency, and fo is the first frequency set by said frequency setting means.

16. A filtering device according to claim 13, wherein the distance d is calculated by said coefficient outputting means from the following expression:

$$d = A \pm (A^2 + C^2 - 1)^{\frac{1}{2}} (|d| < 1),$$

where $A = (D+1)/(D-1)$, $D = 10^{G1/20}$ and G1 is the first gain set by said gain setting means, and is expressed in units of [dB].

17. A filtering device according to claim 16, wherein the distance d calculated by said coefficient outputting means from the frequency fo and the gain G1 is set negative, and the coefficients B1 and B2 are set so as to satisfy a condition B1 > B2.

18. A filtering device according to claim 16, wherein the distance d calculated by said coefficient outputting means from the frequency fo and the gain G1 is set positive, and the coefficients B1 and B2 are set so as to satisfy a condition B1 < B2.

19. A filtering device according to claim 13, wherein the position C is calculated by said coefficient outputting means from the following expression:

$$C = \cos(2\pi fo/fs),$$

where fs is a sampling frequency, and fo is the second frequency set by said frequency setting means.

20. A filtering device according to claim 13, wherein the distance d is calculated by said coefficient outputting means from the following expression:

$$d = A \pm \{A^2 + C^2 - 1\}^{\frac{1}{2}} (|d| < 1),$$

where $A = (D+1)/(D-1)$, $D = 10^{G2/20}$ and G2 is the second gain set by said gain setting means, and is expressed in units of (dB).

21. A filtering device according to claim 20, wherein the distance d calculated by said coefficient outputting means from the frequency fo and the gain G2 is set negative, and the coefficients B3 and B4 are set so as to satisfy a condition B3 > B4.

22. A filtering device according to claim 20, wherein the distance d calculated by said coefficient outputting means from the frequency fo and the gain G2 is set positive, and the coefficients B3 and B4 are set so as to satisfy a condition B3 < B4.

* * * * *